US012074171B2

(12) United States Patent
Oh et al.

(10) Patent No.: US 12,074,171 B2
(45) Date of Patent: Aug. 27, 2024

(54) DISPLAY DEVICE HAVING AN INTERMEDIATE ELECTRODE BETWEEN SUB-AREAS AND CONNECTED TO ELECTRODES OF THE SUBAREAS

(71) Applicant: SAMSUNG DISPLAY CO., LTD., Yongin-Si (KR)

(72) Inventors: Won Sik Oh, Yongin-Si (KR); Yo Han Lee, Yongin-Si (KR); Hyun Min Cho, Yongin-Si (KR); Jong Hyuk Kang, Yongin-Si (KR); Dae Hyun Kim, Yongin-Si (KR)

(73) Assignee: Samsung Display Co., Ltd., Yongin-si (KR)

( * ) Notice: Subject to any disclaimer, the term of this patent is extended or adjusted under 35 U.S.C. 154(b) by 392 days.

(21) Appl. No.: 17/422,426

(22) PCT Filed: Jul. 9, 2019

(86) PCT No.: PCT/KR2019/008426
§ 371 (c)(1),
(2) Date: Jul. 12, 2021

(87) PCT Pub. No.: WO2020/149471
PCT Pub. Date: Jul. 23, 2020

(65) Prior Publication Data
US 2022/0123026 A1    Apr. 21, 2022

(30) Foreign Application Priority Data
Jan. 15, 2019   (KR) ........................ 10-2019-0005444

(51) Int. Cl.
*H01L 27/12*  (2006.01)
*H01L 25/16*  (2023.01)
(Continued)

(52) U.S. Cl.
CPC .......... *H01L 27/124* (2013.01); *H01L 25/167* (2013.01); *H01L 24/24* (2013.01);
(Continued)

(58) Field of Classification Search
CPC ..... H01L 27/124; H01L 25/167; H01L 24/24; H01L 24/95; H01L 33/62;
(Continued)

(56) References Cited

U.S. PATENT DOCUMENTS 8,216,440 B2   7/2012   Shibata et al.
8,872,214 B2   10/2014  Negishi et al.
(Continued)

FOREIGN PATENT DOCUMENTS

JP    2011151268 A    8/2011
JP    2014-075550 A   4/2014
(Continued)

OTHER PUBLICATIONS

International Search Report for corresponding Application No. PCT/KR2019/008426 dated Oct. 24, 2019, 4 pages.
(Continued)

*Primary Examiner* — Lex H Malsawma
(74) *Attorney, Agent, or Firm* — Lewis Roca Rothgerber Christie LLP

(57) ABSTRACT

A display device may include a pixel disposed in a display area. The pixel may include: a first electrode extending in a first direction; a second electrode including a first electrode part spaced apart from the first electrode in a direction intersecting with the first direction and extending in the first direction, a second electrode part extending from the first electrode part in a second direction, and a third electrode part extending form the second electrode part in the first direction; a third electrode including at least one area spaced apart from the third electrode part in the direction intersect-
(Continued)

ing with the first direction and extending in the first direction; a first light emitting element connected between the first electrode and the second electrode; and a second light emitting element connected between the second electrode and the third electrode.

27 Claims, 19 Drawing Sheets

(51) Int. Cl.
  *H01L 23/00* (2006.01)
  *H01L 33/62* (2010.01)
(52) U.S. Cl.
  CPC .............. *H01L 24/95* (2013.01); *H01L 33/62* (2013.01); *H01L 2224/24147* (2013.01); *H01L 2224/95145* (2013.01); *H01L 2924/12041* (2013.01)
(58) Field of Classification Search
  CPC ........... H01L 2224/24147; H01L 2224/95145; H01L 2924/12041
  See application file for complete search history.

(56) References Cited

U.S. PATENT DOCUMENTS

| | | | |
|---|---|---|---|
| 9,112,112 B2 | 8/2015 | Do et al. | |
| 9,773,761 B2 | 9/2017 | Do | |
| 10,461,123 B2 | 10/2019 | Kim et al. | |
| 10,672,946 B2 | 6/2020 | Cho et al. | |
| 11,158,767 B2 | 10/2021 | Biwa et al. | |
| 2008/0251381 A1 | 10/2008 | Shibata et al. | |
| 2011/0089850 A1 | 4/2011 | Shibata et al. | |
| 2011/0210352 A1 | 9/2011 | Lee et al. | |
| 2014/0197433 A1 | 7/2014 | Ishizaki et al. | |
| 2015/0364523 A1 | 12/2015 | Sato | |
| 2018/0019369 A1 | 1/2018 | Cho et al. | |
| 2018/0111829 A1 | 4/2018 | Sam et al. | |
| 2018/0118960 A1 | 5/2018 | Sam et al. | |
| 2018/0175009 A1 | 6/2018 | Kim et al. | |
| 2018/0175106 A1 | 6/2018 | Kim et al. | |
| 2019/0019930 A1* | 1/2019 | Do | H01L 24/95 |
| 2019/0179222 A1 | 6/2019 | Choy et al. | |
| 2020/0219858 A1 | 7/2020 | Chang | |

FOREIGN PATENT DOCUMENTS

| | | |
|---|---|---|
| JP | 2015-011784 A | 1/2015 |
| KR | 20-0410859 U | 3/2006 |
| KR | 10-2011-0041401 A | 4/2011 |
| KR | 10-1244926 B1 | 3/2013 |
| KR | 10-1490758 B1 | 2/2015 |
| KR | 10-2018-0007376 A | 1/2018 |
| KR | 10-2018-0072909 A | 7/2018 |
| WO | WO 2016/157850 A1 | 10/2016 |
| WO | WO 2019/004508 A1 | 1/2019 |

OTHER PUBLICATIONS

Notice of Allowance in corresponding Korean Patent Application No. 10-2019-0005444, dated Jul. 11, 2024, 6 pages.

* cited by examiner

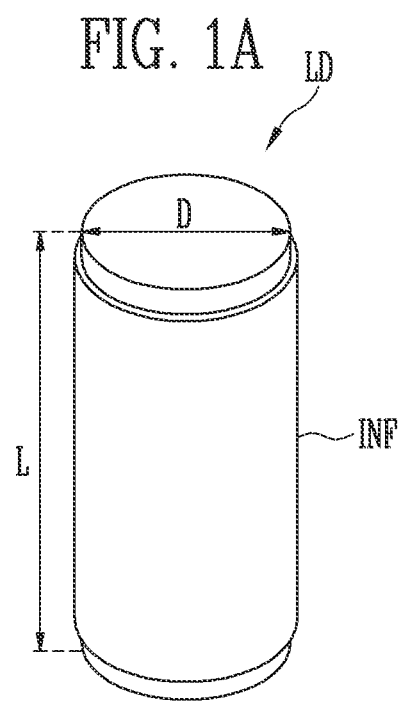
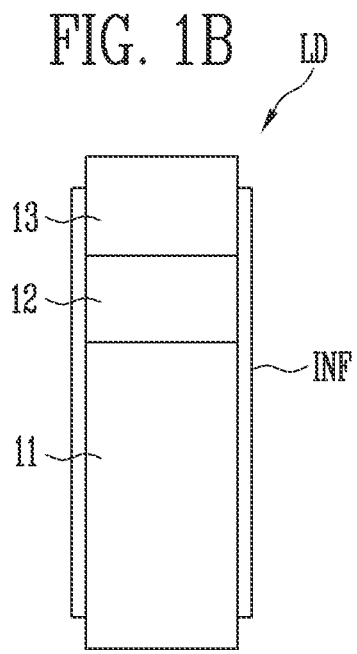

FIG. 9
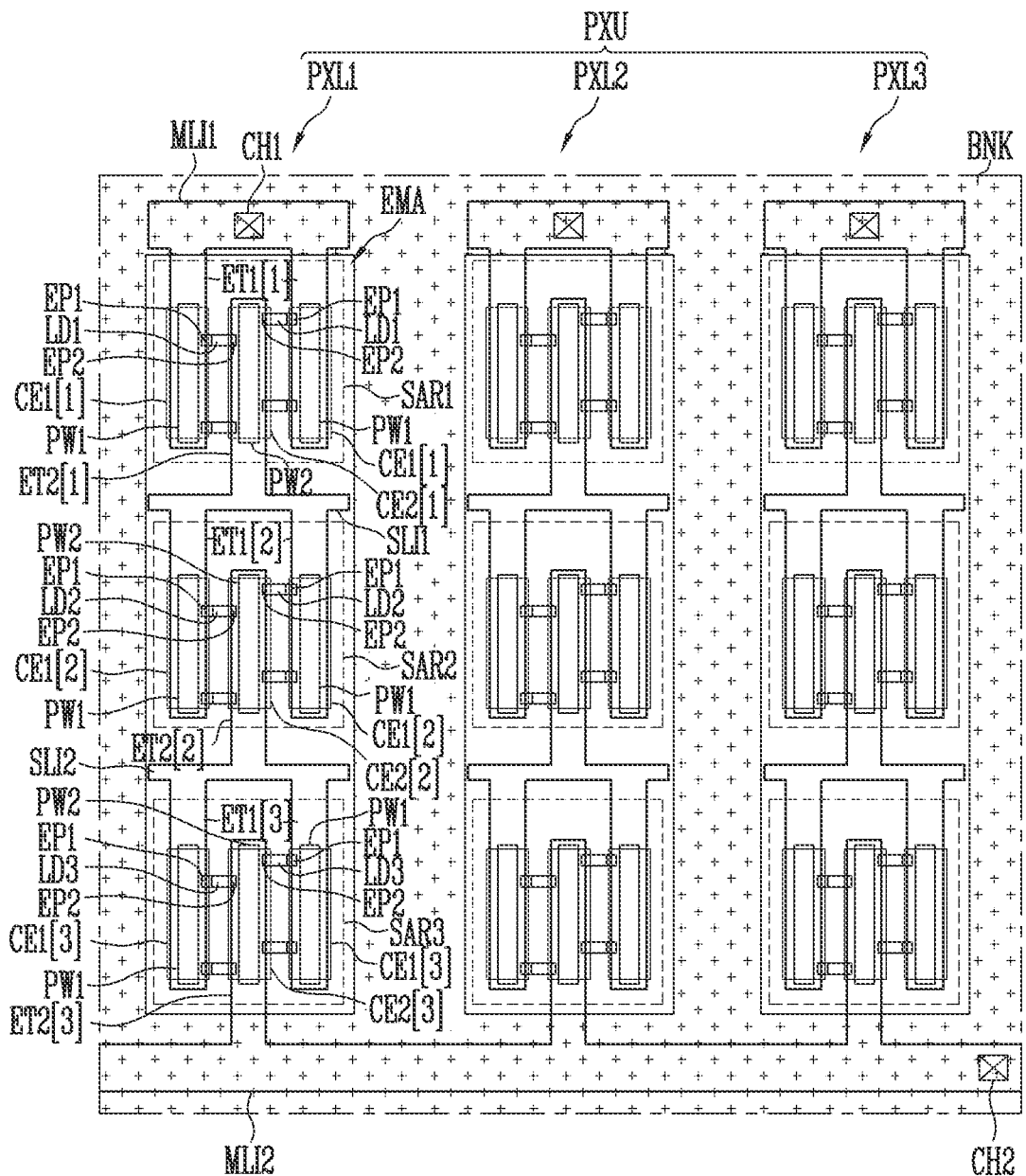
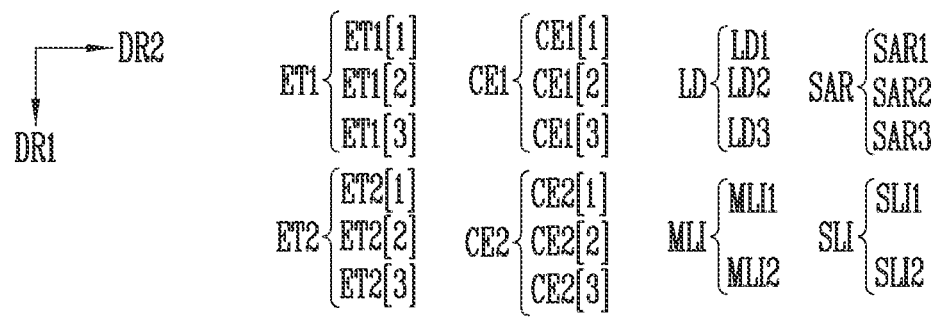

DISPLAY DEVICE HAVING AN INTERMEDIATE ELECTRODE BETWEEN SUB-AREAS AND CONNECTED TO ELECTRODES OF THE SUBAREAS

CROSS-REFERENCE TO RELATED APPLICATIONS

This application is a U.S. National Phase Patent Application of International Patent Application Number PCT/KR2019/008426, filed on Jul. 9, 2019, which claims priority to Korean Patent Application Number 10-2019-0005444, filed on Jan. 15, 2019, the entire content of all of which is incorporated herein by reference.

BACKGROUND

1. Field

Embodiments of the present disclosure relate to a display device.

2. Detailed Description of Related Art

Recently, techniques have been developed for manufacturing a subminiature light emitting element using a material having a reliable inorganic crystal structure, and for manufacturing a light emitting device using the light emitting element. For example, techniques have been developed for fabricating a plurality of subminiature light emitting elements having a small size corresponding to a range from the nanometer scale to the micrometer scale, and for forming light sources of various light emitting devices, e.g., pixels of display devices using the subminiature light emitting elements.

SUMMARY

An aspect of the present disclosure provides a display device including a light emitting element.

A display device in accordance with some embodiments of the present disclosure may include a pixel disposed in a display area. The pixel may include: a first electrode extending in a first direction; a second electrode including a first electrode part spaced apart from the first electrode in a direction intersecting with the first direction and extending in the first direction, a second electrode part extending from the first electrode part in a second direction, and a third electrode part extending form the second electrode part in the first direction; a third electrode including at least one area spaced apart from the third electrode part in the direction intersecting with the first direction, and extending in the first direction; a first light emitting element connected between the first electrode and the second electrode; and a second light emitting element connected between the second electrode and the third electrode.

In some embodiments, the second electrode part may be disposed between the first electrode and the third electrode.

In some embodiments, the first electrode may be spaced apart from the first electrode part with respect to the second direction. The third electrode may be spaced apart from the third electrode part with respect to the second direction.

In some embodiments, the first electrode and the at least one area of the third electrode may be disposed at positions spaced apart from each other on a line with respect to the first direction. The first electrode part and the third electrode part may be disposed on a line with respect to the first direction.

In some embodiments, the first electrode and the third electrode part may be disposed at positions spaced apart from each other on a line with respect to the first direction. The first electrode part and the at least one area of the third electrode may be disposed at positions spaced apart from each other on a line with respect to the first direction.

In some embodiments, the first light emitting element may include a P-type end electrically connected to the first electrode, and an N-type end electrically connected to the second electrode. The second light emitting element may include a P-type end electrically connected to the second electrode, and an N-type end electrically connected to the third electrode.

In some embodiments, the display device may further include: a first electrode line electrically connected to the first electrode, and configured to be supplied with a first power voltage or a first driving signal; and a second electrode line electrically connected to the third electrode, and configured to be supplied with a second power voltage or a second driving signal.

In some embodiments, the display device may further include: a third light emitting element including a P-type end electrically connected to the third electrode, and an N-type end opposite to the P-type end; and a fourth electrode electrically connected between the N-type end of the third light emitting element and the second electrode line.

A display device in accordance with some embodiments of the present disclosure may include a first pixel including light emitting elements provided in a plurality of serial stages. The first pixel may include: first to K-th (K is a natural number of 2 or more) sub-areas respectively corresponding to first to K-th serial stages; first and second electrodes of each of the serial stages disposed at positions spaced apart from each other in each of the first to K-th sub-areas; first to K-th light emitting dements connected between the first and second electrodes in the first to K-th sub-areas, respectively; a first electrode line connected to a first electrode of the first sub-area; a second electrode line connected to a second electrode of the K-th sub-area; and at least one intermediate electrode disposed between two successive sub-areas of the first to K-th sub-areas, and connected to a second electrode of a preceding sub-area and a first electrode of a subsequent sub-area. The intermediate electrode may extend in a direction intersecting with a direction in which the first and second electrodes extend.

In some embodiments, the first and second electrode lines may be disposed to face each other with the first to K-th sub-areas interposed therebetween. Each of the first and second electrode lines may extend in the direction intersecting with the direction in which the first and second electrodes extend.

In some embodiments, the first and second electrode lines and the intermediate electrode may be disposed in parallel to each other with at least one sub-area interposed therebetween.

In some embodiments, the first to K-th sub-areas may be successively disposed in a first direction. The intermediate electrode may extend in a second direction intersecting with the first direction between the two successive sub-areas.

In some embodiments, the first and second electrodes may extend in the first direction and may be disposed in parallel to each other in each of the first to K-th sub-areas.

In some embodiments, the first and the second electrodes may be disposed at regular intervals in each of the first to K-th sub-areas.

In some embodiments, the intermediate electrode may be integrally connected to the second electrode of the preceding sub-area and the first electrode of the subsequent sub-area.

In some embodiments, the intermediate electrode may have a width that is less than a width of each of the first and second electrode lines.

In some embodiments, the first electrode line may be supplied with a first power voltage or a first driving signal. The second electrode line may be supplied with a second power voltage or a second driving signal.

In some embodiments, the first pixel may further include a pixel circuit connected between the first electrode line and a first power supply which supplies the first power voltage.

In some embodiments, the first and second electrodes may be disposed in an identical repetitive pattern in each of the first to K-th sub-areas.

In some embodiments, the first and second electrodes may be disposed in a symmetrical shape based on the intermediate electrode in the two successive sub-areas.

In some embodiments, the display device may further include a second pixel having a structure identical with the first pixel and disposed adjacent to the first pixel. The first electrode lines and the intermediate electrodes of the first and second pixels may be separated from each other between the first and second pixels.

In some embodiments, the second electrode lines of the first and second pixels may be integrally connected with each other.

In some embodiments, the first pixel may further include at least one reverse light emitting element connected between the first and second electrodes in a direction opposite to the light emitting elements in at least one of the plurality of serial stages. The number of reverse light emitting elements may be less than the number of light emitting elements.

In some embodiments, the first pixel may further include at least one of: first partition walls disposed under the respective first electrodes; second partition walls disposed under the respective second electrodes; first contact electrodes disposed over the respective first electrodes and each configured to electrically connect a corresponding one of the first electrodes to a first end of at least one light emitting element; and second contact electrodes disposed over the respective second electrodes and each configured to electrically connect a corresponding one of the second electrodes to a second end of at least one light emitting element.

In some embodiments, the display device may further include a bank configured to integrally enclose an emission area of the first pixel including the first to K-th sub-areas.

In a display device including a pixel in accordance with embodiments of the present disclosure, light emitting elements supplied to an emission area of each pixel may be efficiently used to form each light source unit. In addition, the efficiency of power to be used to align the light emitting elements may be improved.

DESCRIPTION OF DRAWINGS

FIGS. 1A and 1B are respectively a perspective view and a sectional view illustrating a light emitting element in accordance with some embodiments of the present disclosure.

FIGS. 8 and 9 are plan views each illustrating a pixel in accordance with some embodiments of the present disclosure, and for example illustrate modified embodiments pertaining to the embodiments of FIGS. 6 and 7, respectively.

DETAILED DESCRIPTION

Figure 2A:
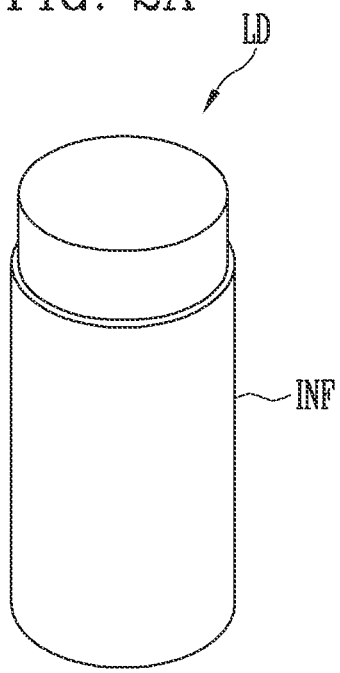
FIGS. 2A and 2B are respectively a perspective view and a sectional view illustrating a light emitting element in accordance with some embodiments of the present disclosure.

Reference will now be made in detail to various embodiments of the present disclosure, specific examples of which are illustrated in the accompanying drawings and described below, since the embodiments of the present disclosure can be variously modified in many different forms. However, the present disclosure is not limited to the following embodiments and may be modified into various forms.

Some elements that are not directly related to the features of the present disclosure in the drawings may be omitted to clearly explain the present disclosure. Furthermore, the sizes, ratios, etc. of some elements in the drawings may be slightly exaggerated. It should be noted that the same reference numerals are used to designate the same or similar elements throughout the drawings, and repetitive explanation will be omitted.

It will be understood that, although the terms "first", "second", etc. may be used herein to describe various elements, these elements should not be limited by these terms. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first component or part is disposed on a second component or part, the first component or part may be not only directly on the second component or part but a third component or part may also intervene between them. Furthermore, the term "position", "direction", etc. used in the following description are defined in relative terms, and it should be noted that they may be changed into a reverse position or direction depending on a view angle or direction. Furthermore, a singular form may include a plural form as long as it is not specifically mentioned in a sentence.

FIGS. 1A, 1B, 2A, 2B, 3A, and 3B are perspective views and sectional views illustrating light emitting dements LD in accordance with embodiments of the present disclosure. Although FIGS. 1A to 3B illustrate cylindrical rod-type light emitting elements LD, the type and/or shape of the light emitting dements LD in accordance with the present disclosure is not limited thereto.

Referring to FIGS. 1A and 1B a light emitting element LD in accordance with some embodiments of the present disclosure may include a first conductivity type semiconductor layer 11 (also referred to as "first semiconductor layer"), a second conductivity type semiconductor layer 13 (also referred to as "second semiconductor layer"), and an active layer 12 interposed between the first and second conductivity type semiconductor layers 11 and 13. For example, the light emitting element LD may include the first conductivity type semiconductor layer 11, the active layer 12, and the second conductivity type semiconductor layer 13 that are successively stacked in a longitudinal direction.

In some embodiments, the light emitting element LD may be provided in the form of a rod extending in one direction. If the direction in which the light emitting element LD extends is defined as a longitudinal direction, the light emitting element LD may have a first end and a second end with respect to the longitudinal direction.

In some embodiments, one of the first and second conductivity type semiconductor layers 11 and 13 may be disposed on the first end of the light emitting element LD. The other one of the first and second conductivity type semiconductor layers 11 and 13 may be disposed on the second end of the light emitting element LD.

In some embodiments, the light emitting element LD may be a rod-type light emitting diode manufactured in the form of a rod. In this specification, the term "rod-type" embraces a rod-like shape and a bar-like shape such as a cylindrical shape and a prismatic shape extending in a longitudinal direction (i.e., to have an aspect ratio greater than 1), and the cross-sectional shape thereof is not limited to a particular shape. For example, the length L of the light emitting element LD may be greater than a diameter D thereof (or a width of the cross-section thereof).

In some embodiments, the light emitting element LD may have a small size ranging from the nanometer scale to the micrometer scale. For example, each light emitting element LD may have a diameter D and/or a length L ranging from the nanometer scale to the micrometer scale. However, in the present disclosure, the size of the light emitting element LD is not limited thereto. For example, the size of the light emitting element LD may be changed in various ways depending on design conditions of various devices, e.g., a display device, which employs, as a light source, a light emitting device using a light emitting element LD.

The first conductivity type semiconductor layer 11 may include, for example, at least one N-type semiconductor layer. For instance, the first conductivity type semiconductor layer 11 may include an N-type semiconductor layer that includes any one semiconductor material of InAlGaN, GaN, AlGaN, InGaN, AlN, and InN, and is doped with a first conductive dopant such as Si, Ge, or Sn. However, the material for forming the first conductivity type semiconductor layer 11 is not limited to this, and the first conductivity type semiconductor layer 11 may be formed of various other materials.

The active layer 12 may be disposed on the first conductivity type semiconductor layer 11 and may have a single or multiple quantum well structure. In some embodiments, a cladding layer (not shown) doped with a conductive dopant may be formed over and/or under the active layer 12. For example, the cladding layer may be formed of an AlGaN layer or an InAlGaN layer. In some embodiments, a material such as AlGaN or AlInGaN may be used to form the active layer 12, and various other materials may be used to form the active layer 12.

If a voltage equal to or greater than a threshold voltage is applied to each of the opposite ends of the light emitting element LD, the light emitting element LD may emit light by recombination of electron-hole pairs in the active layer 12. Since light emission of the light emitting element LD can be controlled based on the foregoing principle, the light emitting element LD may be used as a light source of various light emitting devices as well as a pixel of the display device.

The second conductivity type semiconductor layer 13 may be disposed on the active layer 12 and may include a semiconductor layer having a type different from that of the first conductivity type semiconductor layer 11. For example, the second conductivity type semiconductor layer 13 may include at least one P-type semiconductor layer. For instance, the second conductivity type semiconductor layer 13 may include a P-type semiconductor layer that includes any one semiconductor material of InAlGaN, GaN, AlGaN, InGaN, AlN, and InN, and is doped with a second conductive dopant such as Mg. However, the material for forming the second conductivity type semiconductor layer 13 is not limited to this, and the second conductivity type semiconductor layer 13 may be formed of various other materials.

In some embodiments, the light emitting element LD may further include an insulating film INF provided on the surface of the light emitting element LD. The insulating film INF may be formed on the surface of the light emitting element LD to enclose an outer circumferential surface of at least the active layer 12, and may further enclose predetermined areas of the first and second conductivity type semiconductor layers 11 and 13. Here, the insulating film INF may allow the opposite ends of the light emitting element LD that have different polarities to be exposed to the outside. For example, the insulating film INF may expose one end of each of the first and second conductivity type semiconductor layers 11 and 13 that are disposed on the respective opposite ends of the light emitting element LD with respect to the longitudinal direction, e.g., may expose two base sides of the cylinder (in FIGS. 1A and 1B, the top and bottom surfaces of the light emitting element LD) rather than covering the two base sides.

In some embodiments, the insulating film INF may include at least one insulating material of silicon dioxide ($SiO_2$), silicon nitride ($Si_3N_4$), aluminum oxide ($Al_2O_3$), and titanium dioxide ($TiO_2$), but it is not limited thereto. In other words, the material that forms the insulating film INF is not limited to a particular material, and the insulating film INF may be formed of well-known various insulating materials.

In some embodiments, the light emitting element LD may further include additional other components as well as the first conductivity type semiconductor layer 11, the active layer 12, the second conductivity type semiconductor layer 13, and/or the insulating film INF. For example, the light emitting element LD may further include one or more fluorescent layers, one or more active layers, one or more semiconductor layers, and/or one or more electrode layers disposed on one end of the first conductivity type semiconductor layer 11, the active layer 12, and/or the second conductivity type semiconductor layer 13.

Figure 2B:
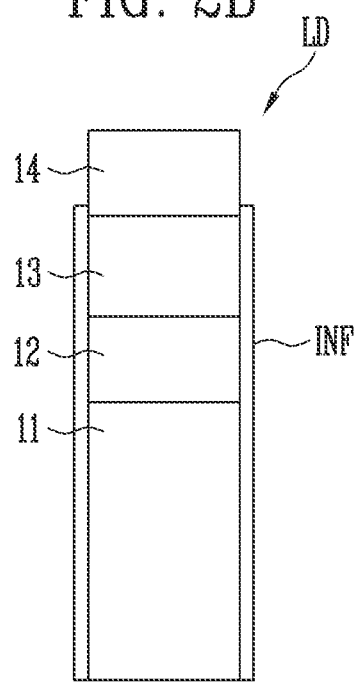
Figure 3A:
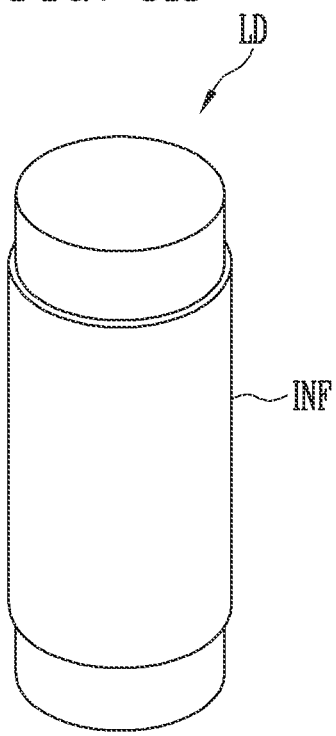
FIGS. 3A and 3B are respectively a perspective view and a sectional view illustrating a light emitting element in accordance with some embodiments of the present disclosure.
Figure 3B:
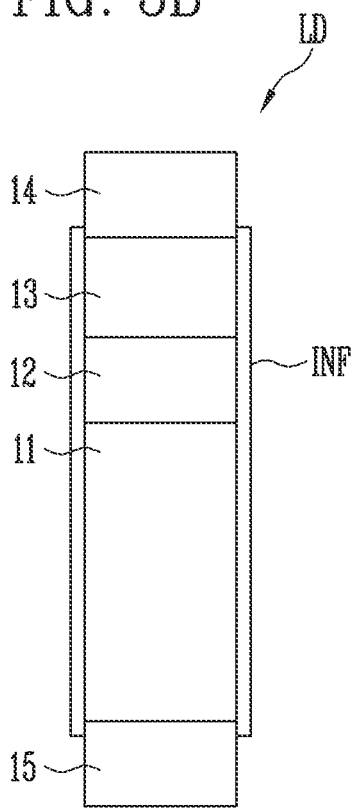

For example, as illustrated in FIGS. 2A and 2B, the light emitting element LD may further include at least one electrode layer 14 disposed on one end of the second conductivity type semiconductor layer 13. In some embodiments, as illustrated in FIGS. 3A and 3B, the light emitting element LD may further include at least one electrode layer 15 disposed on one end of the first conductivity type semiconductor layer 11.

Each of the electrode layers 14 and 15 may be an ohmic contact electrode, but it is not limited thereto. Each of the electrode layers 14 and 15 may include metal or metal oxide. For example, each of the electrode layers 14 and 15 may be formed of transparent electrode materials such as chromium (Cr), titanium (Ti), aluminum (Al), gold (Au), nickel (Ni), oxides or alloys thereof, indium tin oxide (ITO), indium zinc oxide (IZO), zinc oxide (ZnO), or indium tin zinc oxide (ITZO) alone or in combination. In some embodiments, the electrode layers 14 and 15 may be substantially transparent or translucent. Thereby, light generated from the light emitting element LD may be emitted to the outside after passing through the electrode layers 14 and 15.

In some embodiments, the insulating film INF may at least partially enclose the outer circumferential surfaces of the electrode layers 14 and 15, or may not enclose the outer circumferential surfaces. In other words, the insulating film INF may be selectively formed on the surfaces of the electrode layers 14 and 15. Furthermore, the insulating film INF may be formed to expose the opposite ends of the light emitting element LD that have different polarities, for example, may expose at least an area of each of the electrode layers 14 and 15. Alternatively, in some embodiments, the insulating film INF may not be provided.

If the insulating film INF is provided on the surface of the light emitting element LD, for example, on the surface of the active layer 12, the active layer 12 may be prevented from short-circuiting with at least one electrode that is not shown (e.g., at least one contact electrode of contact electrodes connected to the opposite ends of the light emitting element LD), etc. Consequently, the electrical stability of the light emitting element LD may be secured. In the description of the embodiments of the present disclosure, the term "connection" (or "coupling") may comprehensively refer to physical and/or electrical connection (or coupling). Furthermore, the term "connection" (or "coupling") may comprehensively refer to direct and/or indirect connection (or coupling) and integral or non-integral connection.

Furthermore, due to the insulating film INF formed on the surface of the light emitting element LD, occurrence of a defect on the surface of the light emitting element LD may be reduced or minimized, whereby the lifetime and efficiency of the light emitting element LD may be improved. In addition, if the insulating film INF is formed on each light emitting element LD, even when a plurality of light emitting elements LD are disposed adjacent to each other, the light emitting elements LD may be prevented from undesirably short-circuiting.

In some embodiments of the present disclosure, a surface treatment process may be performed to fabricate the light emitting element LD. For example, each light emitting element LD may be surface-treated so that, when a plurality of light emitting elements LD are mixed with a fluidic solution (or solvent) and then supplied to each emission area (e.g., an emission area of each pixel), the light emitting elements LD can be evenly dispersed rather than unevenly aggregating in the solution.

In some embodiments pertaining to this, the insulating film INF itself may be formed of a hydrophobic film using hydrophobic material, or an additional hydrophobic film formed of the hydrophobic material may be formed on the insulating film INF. In some embodiments, the hydrophobic material may be a material containing fluorine to exhibit hydrophobicity. In some embodiments, the hydrophobic material may be applied to the light emitting elements LD in the form of a self-assembled monolayer (SAM). In this case, the hydrophobic material may include octadecyl trichlorosilane, fluoroalkyl trichlorosilane, perfluoroalkyl triethoxysilane, etc. Furthermore, the hydrophobic material may be a commercially available fluorine containing material such as Teflon™ or Cytop™, or a corresponding material. Teflon™ is a registered trademark of The Chemours Company FC, LLC, Delaware, and Cytop™ is a registered trademark of AGC Inc., Japan.

A light emitting device including the light emitting element LD described above may be used not only in a display device but also in various devices that require a light source. For instance, at least one subminiature light emitting element LD, e.g., a plurality of subminiature light emitting elements LD each having a size ranging from the nanometer scale to the micrometer scale, may be disposed in each pixel area of the display panel to form a light source (or, a light source unit) of the corresponding pixel using the subminiature light emitting elements LD. Furthermore, the field of application of the light emitting element LD according to the present disclosure is not limited to a display device. For example, the light emitting element LD may also be used in other types of devices such as a lighting device, which requires a light source.

Figure 4:
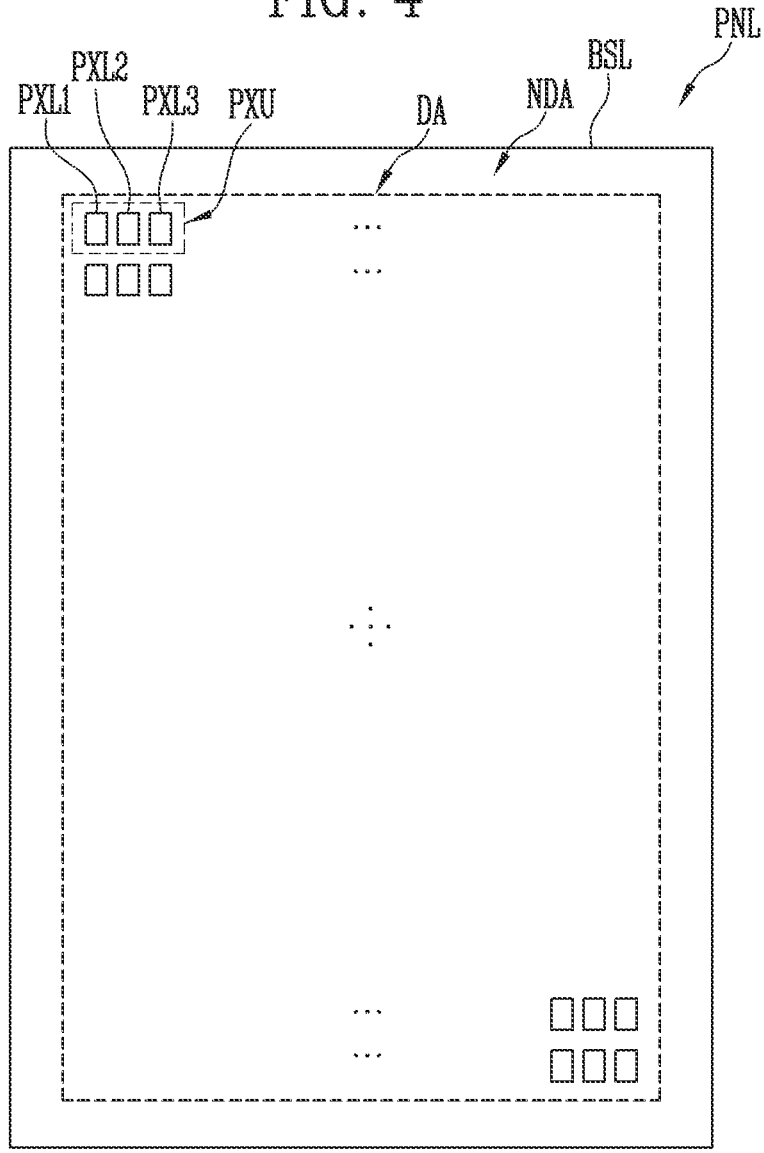
FIG. 4 is a plan view illustrating a display device in accordance with some embodiments of the present disclosure.

FIG. 4 is a plan view illustrating a display device in accordance with some embodiments of the present disclosure. In some embodiments, FIG. 4 illustrates a display device, particularly, a display panel PNL provided in the display device, as an example of a device that may use, as a light source, the light emitting element LD described with reference to FIGS. 1A to 3B. For example, each pixel unit PXU of the display panel PNL and each pixel for forming the pixel unit PXU may include a plurality of light emitting elements LD.

For the sake of explanation, FIG. 4 simply illustrates the structure of the display panel PNL in accordance with some embodiments, focused on a display area DA. In some embodiments, although not illustrated, at least one driving circuit (e.g., at least one of a scan driver and a data driver) and/or a plurality of lines may be further provided in the display panel PNL.

Referring to FIG. 4, the display panel PNL in accordance with some embodiments of the present disclosure may include a base layer BSL, and a plurality of pixels disposed on the base layer BSL. In some embodiments, the pixels may include first pixels PXL1 configured to emit a first color of light, second pixels PXL2 configured to emit a second color of light, and/or third pixels PXL3 configured to emit a third color of light. In the following embodiments, the term "pixel PXL" or "pixels PXL" will be used to collectively designate any one pixel or two or more kinds of pixels among the first pixels PXL1, the second pixels PXL2, and the third pixels PXL3.

In detail, the display panel PNL and the base layer BSL for forming the display panel PNL may include a display area DA for displaying an image, and a non-display area NDA formed in a predetermined area other than the display area DA. The pixels PXL may be disposed in the display area DA on the base layer BSL.

In some embodiments, the display area DA may be disposed in a central area of the display panel PNL, and the non-display area NDA may be disposed in a perimeter area of the display panel PNL in such a way as to enclose the display area DA. The locations of the display area DA and the non-display area NDA are not limited to this, and the locations thereof may be changed. The display area DA may form a screen on which an image is displayed.

The base layer BSL may form a base of the display panel PNL. In some embodiments, the base layer BSL may be a rigid or flexible substrate or film, and the material or properties thereof are not particularly limited. For example, the base layer BSL may be a rigid substrate made of glass or reinforced glass, a flexible substrate (or a thin film) formed of plastic or metal, or at least one insulating layer, and the material and/or properties thereof are not particularly limited.

Furthermore, the base layer BSL may be transparent, but the present disclosure is not limited thereto. For instance, the base layer BSL may be a transparent, translucent, opaque, or reflective base.

One area on the base layer BSL may be defined as the display area DA in which the pixels PXL are disposed, and the other area thereof may be defined as the non-display area NDA. For example, the base layer BSL may include the display area DA including a plurality of pixel areas in which the respective pixels PXL are formed, and the non-display area NDA disposed around the display area DA. Each pixel area may comprehensively refer to a pixel circuit area in which a pixel circuit of the corresponding pixel PXL is formed, and/or an emission area in which light emitting elements constituting a light source (or a light source unit) of the pixel PXL, and first and second electrodes connected thereto, are disposed. Various lines and/or internal circuits that are connected to the pixels PXL of the display area DA may be disposed in the non-display area NDA.

A plurality of pixels PXL are dispersed and disposed in the display area DA. For example, the plurality of pixels PXL may be regularly arranged in the display area DA in a stripe or PenTile® arrangement manner or the like. PEN-TILE® is a registered trademark of Samsung Display Co., Ltd., Republic of Korea. The arrangement structure of the pixels PXL is not limited thereto, and the pixels PXL may be arranged in the display area DA in various structures and/or schemes.

In some embodiments, two or more kinds of pixels PXL that emit different colors of light may be disposed in the display area DA. For example, first pixels PXL1 configured to emit a first color of light, second pixels PXL2 configured to emit a second color of light, and a third pixels PXL3 configured to emit a third color of light may be disposed in the display area DA. At least one first pixel PXL1, at least one second pixel PXL2, and at least one third pixel PXL3 that are disposed adjacent to each other may form one pixel unit PXU that may emit different colors of light.

In some embodiments, each first pixel PXL1 may be a red pixel that emits red light, each second pixel PXL2 may be a green pixel that emits green light, and each third pixel PXL3 may be a blue pixel that emits blue light. In some embodiments, the first pixels PXL1, the second pixels PXL2, and the third pixels PXL3 may include, as light sources, a light emitting element related to the first color, a light emitting element related to the second color, and a light emitting element related to the third color, so that the pixels may respectively emit the first color of light, the second color of light, and the third color of light. In some embodiments, the first pixels PXL1, the second pixels PXL2, and the third pixels PXL3 may respectively have light emitting elements configured to emit the same color of light, and may include color filters and light conversion layers having different colors and being disposed on the respective light emitting elements, so as to respectively emit the first color of light, the second color of light, and the third color of light.

However, the colors, the types, and/or the number of pixels PXL that form each pixel unit PXU are not particularly limited. For example, the color of light to be emitted from each pixel PXL may be changed in various ways.

Each pixel PXL may include at least one light source that is driven by a predetermined control signal (e.g., a scan signal and a data signal) and/or a predetermined power supply (e.g., a first power supply and a second power supply). For example, each of the pixels PXL may include a light emitting element LD in accordance with any one of the embodiments of FIGS. 1A to 3B, e.g., at least one subminiature rod-type light emitting element LD having a small size corresponding to the nanometer scale to the micrometer scale. However, in embodiments of the present disclosure, the type of the light emitting element LD that may be used as a light source of the pixel PXL is not limited thereto. For example, in some embodiments, each pixel PXL may include a light emitting element that has a core-shell structure and is fabricated by a growth method. In some embodiments, the light emitting element having the core-shell structure may be a subminiature core-shell light emitting element having a small size corresponding to the nanometer scale to the micrometer scale, but the size of the light emitting element having the core-shell structure is not limited.

In some embodiments, each pixel PXL may be formed of an active pixel. However, the types, structures, and/or driving schemes of the pixels PXL capable of being applied to the display device according to the present disclosure are not particularly limited. For example, each pixel PXL may have the same structure as that of a pixel for passive or active light emitting display devices that have various known structures and/or may be operated in various known driving schemes.

FIGS. 5A to 5E are circuit diagrams each illustrating a pixel PXL in accordance with some embodiments of the present disclosure. For example, FIGS. 5A to 5E illustrate different embodiments of the pixel PXL that can be applied to an active display device. However, the types of pixels PXL and display devices to which embodiments of the present disclosure may be applied are not limited thereto. In some embodiments, each pixel PXL illustrated in FIGS. 5A to 5E may be any one of the pixels PXL provided on the display panel PNL of FIG. 4. The pixels PXL may have substantially the same or similar structure. For example, each pixel PXL illustrated in FIGS. 5A to 5E may be any one of the first, second, and third pixels PXL1, PXL2, and PXL3 of FIG. 4. The first, second, and third pixels PXL1, PXL2, and PXL3 may have substantially the same structure.

Figure 5A:
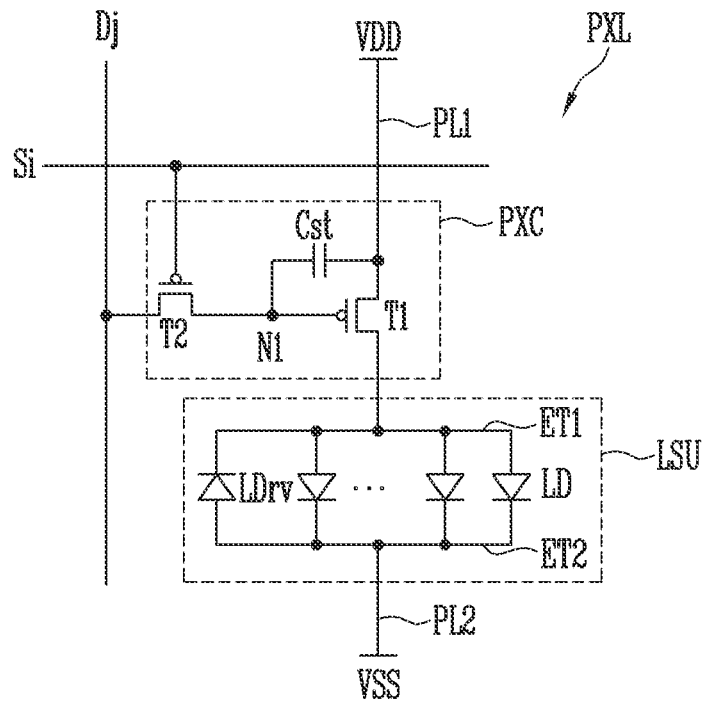
FIGS. 5A to 5E are circuit diagrams each illustrating a pixel in accordance with some embodiments of the present disclosure.

Referring to FIG. 5A, the pixel PXL in accordance with some embodiments of the present disclosure may include a light source unit LSU configured to generate light having a luminance corresponding to a data signal. The pixel PXL may further include a pixel circuit PXC configured to drive the light source unit LSU.

In some embodiments, the light source unit LSU may include a plurality of light emitting elements LD that are electrically connected to each other between a first power supply VDD which supplies a first power voltage and a second power supply VSS which supplies a second power voltage. For example, the light source unit LSU may include a first electrode ET1 connected to the first power supply VDD, a second electrode ET2 connected to the second power supply VSS, and a plurality of light emitting elements LD connected in parallel to each other in the same direction between the first and second electrodes ET1 and ET2. In some embodiments, the first electrode ET1 may be an anode electrode, and the second electrode ET2 may be a cathode electrode.

In some embodiments, each of the light emitting elements LD may include a P-type end connected to the first power supply VDD through the first electrode ET1, and an N-type end connected to the second power supply VSS through the second electrode ET2. In some embodiments, the light emitting elements LD may be connected in parallel between the first electrode ET1 and the second electrode ET2 in a forward direction. As such, each of the light emitting elements LD connected in a forward direction between the first power supply VDD and the second power supply VSS may form a valid light source. A group of valid light sources may form the light source unit LSU of the pixel PXL.

In some embodiments, the first and second power supplies VDD and VSS may have different potentials to make it possible for the light emitting elements LD to emit light. For example, the first power supply VDD may be set as a high-potential power supply, and the second power supply VSS may be set as a low-potential power supply. Here, a difference in potential between the first and second power supplies VDD and VSS may be set to a threshold voltage of the light emitting elements LD or more during at least an emission period of the pixel PXL.

In some embodiments, the first ends (e.g., the P-type ends) of the light emitting elements LD that form each light source unit LSU may be connected in common to the pixel circuit PXC through one electrode of the light source unit LSU (e.g., the first electrode ET1 (also referred to as "first pixel electrode") of each pixel PXL), and may be connected to the first power supply VDD through the pixel circuit PXC and the first power line PL1. The second ends (e.g., the N-type ends) of the light emitting elements LD may be connected in common to the second power supply VSS through another electrode of the light source unit LSU (e.g., a second electrode ET2 (also referred to as "second pixel electrode") of each pixel PXL) and the second power line PL2.

The light emitting elements LD of the light source unit LSU may emit light having a luminance corresponding to driving current supplied thereto through the pixel circuit PXC. For example, during each frame period, the pixel circuit PXC may supply, to the light source unit LSU, driving current corresponding to a gray scale value of data of the corresponding frame. The driving current supplied to the light source unit LSU may be divided into parts that flow to the light emitting elements LD connected in the forward direction. Hence, each of the light emitting elements LD may emit light having a luminance corresponding to current applied thereto, so that the light source unit LSU may emit light having a luminance corresponding to the driving current.

In some embodiments, the light source unit LSU may further include at least one invalid light source, as well as including the light emitting elements LD that form each valid light source. For example, at least one reverse light emitting element LDrv may be further connected between the first and second electrodes ET1 and ET2 of the light source unit LSU.

Each reverse light emitting element LDrv, along with the light emitting elements LD that form the valid light sources, may be connected in parallel to each other between the first and second electrodes ET1 and ET2, and may be connected between the first and second electrodes ET1 and ET2 in a direction opposite to that of the light emitting elements LD. For example, the N-type end of the reverse light emitting element LDrv may be connected to the first power supply VDD via the first electrode ET1. The P-type end of the reverse light emitting element LDrv may be connected to the second power supply VSS via the second electrode ET2. Even when a predetermined driving voltage (e.g., a normal directional driving voltage) is applied between the first and second electrodes ET1 and ET2, the reverse light emitting element LDrv remains deactivated. Hence, current does not substantially flow through the reverse light emitting element LDrv.

In some embodiments, at the step of aligning the light emitting elements LD between the first and second electrode ET1 and ET2 to form each light source unit LSU, the light emitting elements LD supplied to each pixel area (e.g., the emission area of each pixel PXL) may be controlled to be aligned and biased in any one direction (e.g., the forward direction) by adjusting alignment signals (or alignment voltages) to be applied to the first and second electrodes ET1 and ET2 or forming a magnetic field. In this case, at least one reverse light emitting element LDrv connected in a reverse direction, along with a plurality of light emitting elements LD connected in the forward direction, may be further connected between the first and second electrodes ET1 and ET2 of each pixel PXL. In some embodiments, in the case where the light emitting elements LD are biased-aligned so as to increase the number of light emitting elements LD connected in the forward direction between the first and second electrodes ET1 and ET2 of each pixel PXL, the number of reverse light emitting elements LDrv connected in the reverse direction between the first and second electrodes ET1 and ET2 may be less than the number of light emitting elements LD connected in the forward direction. For example, the number of reverse light emitting elements LDrv connected in the reverse direction between the first and second electrodes ET1 and ET2 may be 30% of the number of light emitting elements LD connected in the forward direction or less.

The pixel circuit PXC may be connected to a scan line Si and a data line Dj of the corresponding pixel PXL. For example, if the pixel PXL is disposed on an i-th row is a natural number) and a j-th column (j is a natural number) of the display area DA, the pixel circuit PXC of the pixel PXL may be connected to an i-th scan line Si and a j-th data line Dj of the display area DA. In some embodiments, the pixel circuit PXC may include first and second transistors T1 and T2, and a storage capacitor Cst.

The first transistor (also referred to as "driving transistor) T1 is connected between the first power supply VDD and the light source unit LSU. A gate electrode of the first transistor T1 is connected to a first node N1. The first transistor T1 may control driving current to be supplied to the light source unit LSU in response to the voltage of the first node N1.

The second transistor (also referred to as "switching transistor") T2 may be connected between the data line Dj and the first node N1. A gate electrode of the second transistor T2 is connected to the scan line Si. When a scan signal having a gate-on voltage (e.g., a low level voltage) is supplied from the scan line Si, the second transistor T2 is turned on to electrically connect the first node N1 to the data line Dj.

During each frame period, a data signal of a corresponding frame is supplied to the data line Dj. The data signal is transmitted to the first node N1 via the second transistor T2.

Thereby, a voltage corresponding to the data signal is charged to the storage capacitor Cst.

One electrode of the storage capacitor Cst is connected to the first power supply VDD, and the other electrode thereof is connected to the first node N1. The storage capacitor Cst may charge a voltage corresponding to a data signal to be supplied to the first node N1 during each frame period.

Although in FIG. 5A the transistors, e.g., the first and second transistors T1 and T2, included in the pixel circuit PXC have been illustrated as being formed of P-type transistors, the present disclosure is not limited to this. In other words, at least one of the first and second transistors T1 and T2 may be changed to an N-type transistor.

Figure 5B:
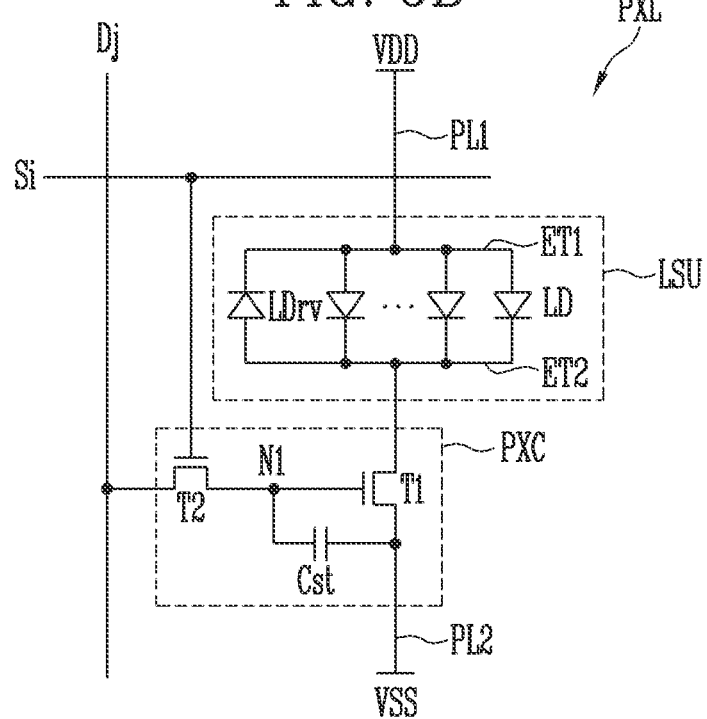

For example, as shown in FIG. 5B, both the first and second transistors T1 and T2 may be formed of N-type transistors. In this case, the gate-on voltage of the scan signal for writing the data signal supplied to the data line Dj in each frame period to the pixel PXL may be a high level voltage. Likewise, the voltage of the data signal for turning on the first transistor T1 may be a voltage having a level opposite to that of the embodiments of FIG. 5A. For example, in the embodiments of FIG. 5B, as a gray scale value that is to be expressed increases, a data signal having a higher voltage may be supplied.

The pixel PXL shown in FIG. 5B is substantially similar in configuration and operation to the pixel PXL of FIG. 5A, except that the connection positions of some circuit elements and the voltage levels of control signals (e.g., a scan signal and a data signal) are changed depending on a change in type of the transistor. Therefore, detailed description of the pixel PXL of FIG. 5B will be omitted.

The structure of the pixel circuit PXC is not limited to the embodiments shown in FIGS. 5A and 5B. In other words, the pixel circuit PXC may be formed of a well-known pixel circuit that may have various structures and/or may be operated by various driving schemes. For example, the pixel circuit PXC may be configured in the same manner as that of the embodiments illustrated in FIG. 5C.

Figure 5C:
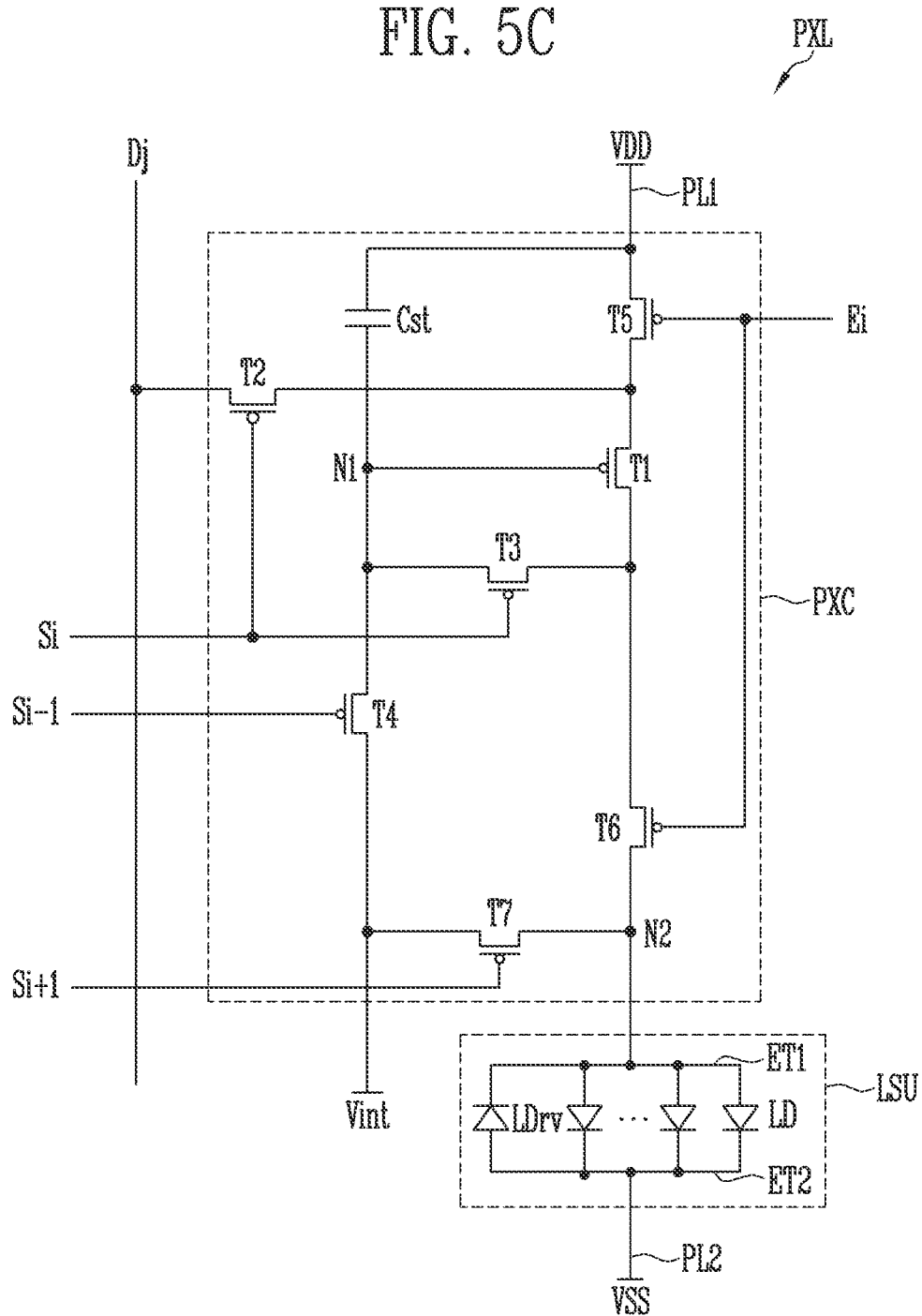

Referring to FIG. 5C, the pixel circuit PXC may be connected not only to a scan line Si of a corresponding horizontal line but also to at least one another scan line (or a control line). For example, the pixel circuit PXC of the pixel PXL disposed on the i-th row of the display area DA may be further connected to an i−1-th scan line Si−1 and/or an i+1-th scan line Si+1. In some embodiments, the pixel circuit PXC may be connected not only to the first and second power supplies VDD and VSS but also to a third power supply. For instance, the pixel circuit PXC may also be connected to an initialization power supply Vint. In some embodiments, the pixel circuit PXC may include first to seventh transistors T1 to T7 and a storage capacitor Cst.

The first transistor T1 may be connected between the first power supply VDD and the light source unit LSU. For example, a first electrode (e.g., a source electrode) of the first transistor T1 may be connected to the first power supply VDD through the fifth transistor T5 and the first power line PL1, and a second electrode (e.g., a drain electrode) of the first transistor T1 may be connected via the sixth transistor T6 to the first electrode of the light source unit LSU (e.g., the first contact electrode and/or the first pixel electrode of the corresponding pixel PXL). A gate electrode of the first transistor T1 is connected to a first node N1 The first transistor T1 may control driving current to be supplied to the light source unit LSU in response to the voltage of the first node N1.

The second transistor T2 is connected between the data line Dj and the first electrode of the first transistor T1. A gate electrode of the second transistor T2 is connected to the corresponding scan line Si. When a scan signal having a gate-on voltage is supplied from the scan line Si, the second transistor T2 may be turned on to electrically connect the data line Dj to the first electrode of the first transistor T1. Hence, if the second transistor T2 is turned on, a data signal supplied from the data line Dj may be transmitted to the first transistor T1.

The third transistor T3 is connected between the other electrode of the first transistor T1 and the first node N1. A gate electrode of the third transistor T3 is connected to the corresponding scan line Si. When a scan signal having a gate-on voltage is supplied from the scan line Si, the third transistor T3 may be turned on to electrically connect the first transistor T1 in the form of a diode.

The fourth transistor T4 may be connected between the first node N1 and the initialization power supply Vint. A gate electrode of the fourth transistor T4 is connected to a preceding scan line, e.g., an i−1-th scan line Si−1. When a scan signal of a gate-on voltage is supplied to the i−1-th scan line Si−1, the fourth transistor T4 may be turned on so that the voltage of the initialization power supply Vint may be transmitted to the first node N1. In some embodiments, when the first transistor T1 is a P-type transistor, the voltage of the initialization power supply Vint for initializing the gate voltage of the first transistor T1 may be the lowest voltage of the data signal or less.

The fifth transistor T5 is connected between the first power supply VDD and the first transistor T1. A gate electrode of the fifth transistor T5 is connected to a corresponding emission control line, e.g., an i-th emission control line Ei. The fifth transistor T5 may be turned off when an emission control signal having a gate-off voltage (e.g., a high level voltage) is supplied to the emission control line Ei. and may be turned on in other cases.

The sixth transistor T6 is connected between the first transistor T1 and the light source unit LSU. A gate electrode of the sixth transistor T6 is connected to a corresponding emission control line, e.g., the i-th emission control line Ei. The sixth transistor T6 may be turned off when an emission control signal having a gate-off voltage is supplied to the emission control line Ei, and may be turned on in other cases.

The seventh transistor T7 is connected between a second node N2, to which the first electrode of the light source unit LSU (e.g., the first pixel electrode ET1 of the corresponding pixel PXL) is connected, and the initialization power supply Vint. A gate electrode of the seventh transistor T7 is connected to any one of scan lines of a subsequent stage (a subsequent horizontal pixel column), e.g., to the i+1-th scan line Si+1. When a scan signal of a gate-on voltage is supplied to the i+1-th scan line Si+1, the seventh transistor T7 may be turned on so that the voltage of the initialization power supply Vint may be supplied to the first electrode of the light source unit LSU. In this case, during each initialization period in which the voltage of the initialization power supply Vint is transmitted to the light source unit LSU, the voltage of the first electrode of the light source unit LSU may be initialized. The control signal for controlling the operation of the seventh transistor T7 may be changed in various ways. For example, in some embodiments, the gate electrode of the seventh transistor T7 may be connected to a scan line of a corresponding horizontal line, i.e., an i-th scan line Si. In this case, when a scan signal having a gate-on voltage is supplied to the i-th scan line Si, the seventh transistor T7 may be turned on so that the voltage of the initialization power supply Vint may be supplied to the first electrode of the light source unit LSU.

The storage capacitor Cst may be connected between the first power supply VDD and the first node N1. The storage capacitor Cst may store a voltage corresponding to both the data signal applied to the first node N1 during each frame period and the threshold voltage of the first transistor T1.

Although in FIG. 5C the transistors, e.g., the first to seventh transistors T1 to T7, included in the pixel circuit PXC have been illustrated as being formed of P-type transistors, the present disclosure is not limited thereto. For example, at least one of the first to seventh transistors T1 to T7 may be changed to an N-type transistor.

Figure 5D:
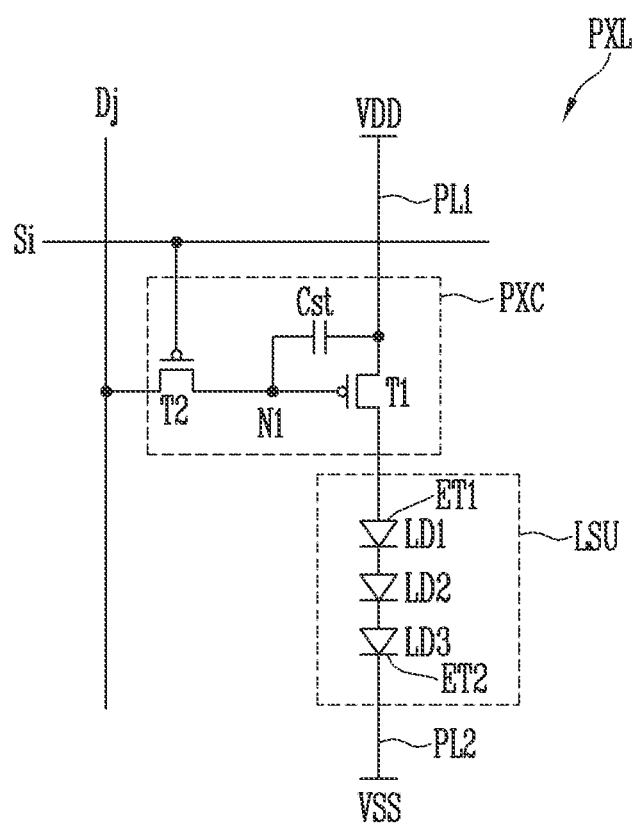
Figure 5E:
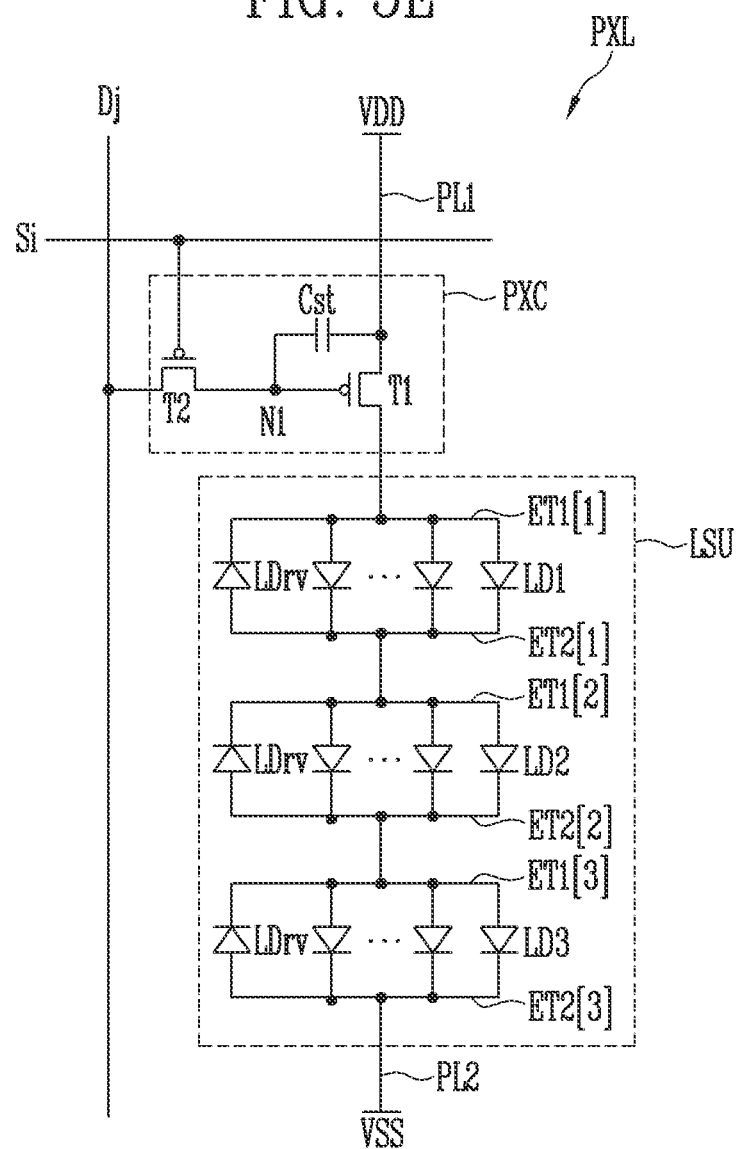

Although FIGS. 5A to 5C illustrate embodiments in which all valid light sources, i.e., light emitting elements LD, constituting each light source unit LSU are connected in parallel to each other, the present disclosure is not limited thereto. For example, in some embodiments of the present disclosure, as illustrated in FIGS. 5D and 5E, the light source unit LSU of each pixel PXL may be configured to include a serial structure. In the following descriptions of embodiments of FIGS. 5D and 5E, repeated detailed explanations of components (e.g., the pixel circuit PXC) that are similar or equal to that of the embodiments of FIGS. 5A to 5C will be omitted.

Referring to FIG. 5D, the light source unit LSU may include a plurality of light emitting elements connected in series to each other. For example, the light source unit LSU may include first, second, and third light emitting elements LD1, LD2, and LD3 that are connected in series in a forward direction between the first power supply VDD and the second power supply VSS and that each constitute a valid light source. Hereinafter, when a specific light emitting element among the first, second, and third light emitting elements LD1, LD2, and LD3 is designated, the corresponding light emitting element will be referred to as a first light emitting element LD1, a second light emitting element LD2, or a third light emitting element LD3. The term "light emitting element LD" or "light emitting elements LD" will be used to arbitrarily designate at least one light emitting element of the first, second, and the third light emitting elements LD1, LD2, and LD3 or collectively designate the first, second, and third light emitting elements LD1, LD2, and LD3.

The P-type end of the first light emitting element LD1 may be connected to the first power supply VDD through the first electrode ET1 of the light source unit LSU. The N-type end of the first light emitting element LD1 may be connected to the P-type end of the second light emitting element LD2. The P-type end of the second light emitting element LD2 may be connected to the N-type end of the first light emitting element LD1. The N-type end of the second light emitting element LD2 may be connected to the P-type end of the third light emitting element LD3. The P-type end of the third light emitting element LD3 may be connected to the N-type end of the second light emitting element LD2. The N-type end of the third light emitting element LD3 may be connected to the second power supply VSS through the second electrode ET2 of the light source unit LSU and the second power line PL2. In this way, the first, second, and the third light emitting elements LD1, LD2, and LD3 may be connected in series between the first and second electrodes ET1 and ET2 of the light source unit LSU.

Although in FIG. 5D there is illustrated some embodiments where the light emitting elements LD are connected to have a three-stage serial structure, the present disclosure is not limited thereto. For example, in some embodiments of the present disclosure, two light emitting elements LD may be connected to have a two-stage serial structure, or four or more light emitting elements LD may be connected to have a four-or-more-stage serial structure.

When it is assumed that the same luminance is expressed using light emitting elements LD having the same conditions (e.g., the same size and/or number), in a light source unit LSU having a structure in which light emitting elements LD are connected in series, the voltage to be applied between the first and second electrodes ET1 and ET2 may be increased, and the amount of driving current flowing to the light source unit LSU may be reduced, compared to a light source unit LSU having a structure in which light emitting elements LD are connected in parallel. Therefore, in the case where the light source unit LSU of each pixel PXL is formed of a serial structure, panel current flowing through the display panel PNL may be reduced as the display device is driven. Hence, power consumption may be reduced.

In some embodiments, at least one serial stage may include a plurality of light emitting dements LD connected in parallel to each other. In this case, the light source unit LSU may be formed of a serial/parallel combination structure. For example, the light source unit LSU may be configured as illustrated in the embodiments of FIG. 5E.

Referring to FIG. 5E, each serial stage of the light source unit LSU may include a plurality of light emitting elements LD connected in parallel to each other. For example, the light source unit LSU may include a plurality of first light emitting elements LD1 disposed in a first serial stage (also referred to as "first stage" or "first row"), and a plurality of second light emitting elements LD2 disposed in a second serial stage (also referred to as "second stage" or "second row") subsequent to the first serial stage. Furthermore, the light source unit LSU may selectively further include at least one serial stage subsequent to the second serial stage. For example, the light source unit LSU may further include a plurality of third light emitting elements LD3 disposed in a third serial stage (referred to as "third stage" or "third row") subsequent to the second serial stage. In some embodiments, at least one serial stage may further include at least one reverse light emitting element LDrv, but the present disclosure is not limited thereto. For example, each pixel PXL may further include at least one reverse light emitting element LDrv connected in a direction that is opposite to that of the light emitting elements LD in at least one of a plurality of serial stages. In some embodiments, in the case where the light emitting elements LD are aligned such that the light emitting elements LD supplied to each pixel area (e.g., the emission area of each pixel PXL) are biased in any one direction (e.g., the forward direction) by controlling alignment signals (or alignment voltages) or forming a magnetic field, the number of reverse light emitting elements LDrv disposed in each pixel PXL may be less than the number of valid light sources, i.e., the light emitting elements LD, disposed in the forward direction in the pixel PXL.

The first light emitting elements LD1 may be connected in parallel to each other between the first and second electrodes ET1[1] and ET2[1] of the first serial stage. The second light emitting elements LD2 may be connected in parallel to each other between the first and second electrodes ET1[2] and ET2[2] of the second serial stage. The third light emitting elements LD3 may be connected in parallel to each other between the first and second electrodes ET1[3] and ET2[3] of the third serial stage.

In some embodiments, the first and second electrodes ET1[1] to ET1[3] and ET2[1] to ET2[3] disposed in each serial stage may form sub-electrodes (also referred to as "split electrodes") dispersed and disposed in the light source unit LSU. Hereinafter, the term "first electrode ET1" (also referred to as "first sub-electrode") will be used to arbitrarily designate at least one first electrode among the first electrodes ET1[1] to ET1[3] (also referred to as "first sub-electrodes") disposed in each serial stage, or collectively designate the first electrodes ET1[1] to ET1[3] disposed in each serial stage. Likewise, the term "second electrode ET2" (also referred to as "second sub-electrode") will be used to arbitrarily designate at least one second electrode among the second electrodes ET2[1] to ET2[3] (also referred to as "second sub-electrodes") disposed in each serial stage, or collectively designate the second electrodes ET2[1] to ET2[3] disposed in each serial stage.

As such, in the case where the light source unit LSU of each pixel PXL is configured by connecting a plurality of light emitting elements LD in a serial/parallel combination structure, driving current/voltage conditions may be sufficiently controlled to correspond to specifications of a desired product. For example, when it is assumed that light emitting elements LD having the same conditions (e.g., the same size and/or number) are used and express the same luminance, the light source unit LSU in which the light emitting elements LD are connected in the serial/parallel combination structure makes it possible to reduce driving current compared to that of the light source unit LSU having a structure in which all of the light emitting elements LD are connected in parallel to each other, as shown in the embodiments of FIGS. 5A to 5C, and makes it possible to reduce driving voltages to be applied to the opposite ends of the light source unit LSU compared to that of the light source unit LSU having a structure in which all of the light emitting elements LD are connected in series, as shown in the embodiments of FIG. 5D. In the case where all of the light emitting elements LD are connected in series, if at least one of the light emitting elements LD connected in series to each other is not completely connected in the forward direction, a path along which the driving current is able to flow in the pixel PXL is blocked, whereby a black spot defect may be caused. On the other hand, in the case where the light emitting elements LD are connected to each other in the serial/parallel combination structure, even if some light emitting elements LD in each serial stage are not completely connected in the forward direction or defects occur in some light emitting elements LD, the driving current is allowed to flow through the other light emitting elements LD of the corresponding serial stage. Therefore, defects of the pixel PXL may be prevented or reduced.

As shown in the foregoing embodiments, the pixel PXL in accordance with some embodiments of the present disclosure may include a pixel circuit PXC and/or a light source unit LSU that may have various structures. The structure of the pixel PXL that may be applied to the present disclosure is not limited to the embodiments illustrated in FIGS. 5A to 5E, and each pixel PXL may have various well-known structures. For example, the pixel circuit PXC included in each pixel PXL may be formed of a well-known pixel circuit that may have various structures and/or may be operated by various driving schemes. In some embodiments of the present disclosure, each pixel PXL may be configured in a passive light emitting display device, or the like. In this case, the pixel circuit PXC may be omitted, and each of the first and second electrodes ET1 and ET2 of the light source unit LSU may be directly connected to the scan line Si, the data line Dj, a power line, and/or a control line.

Figure 6:
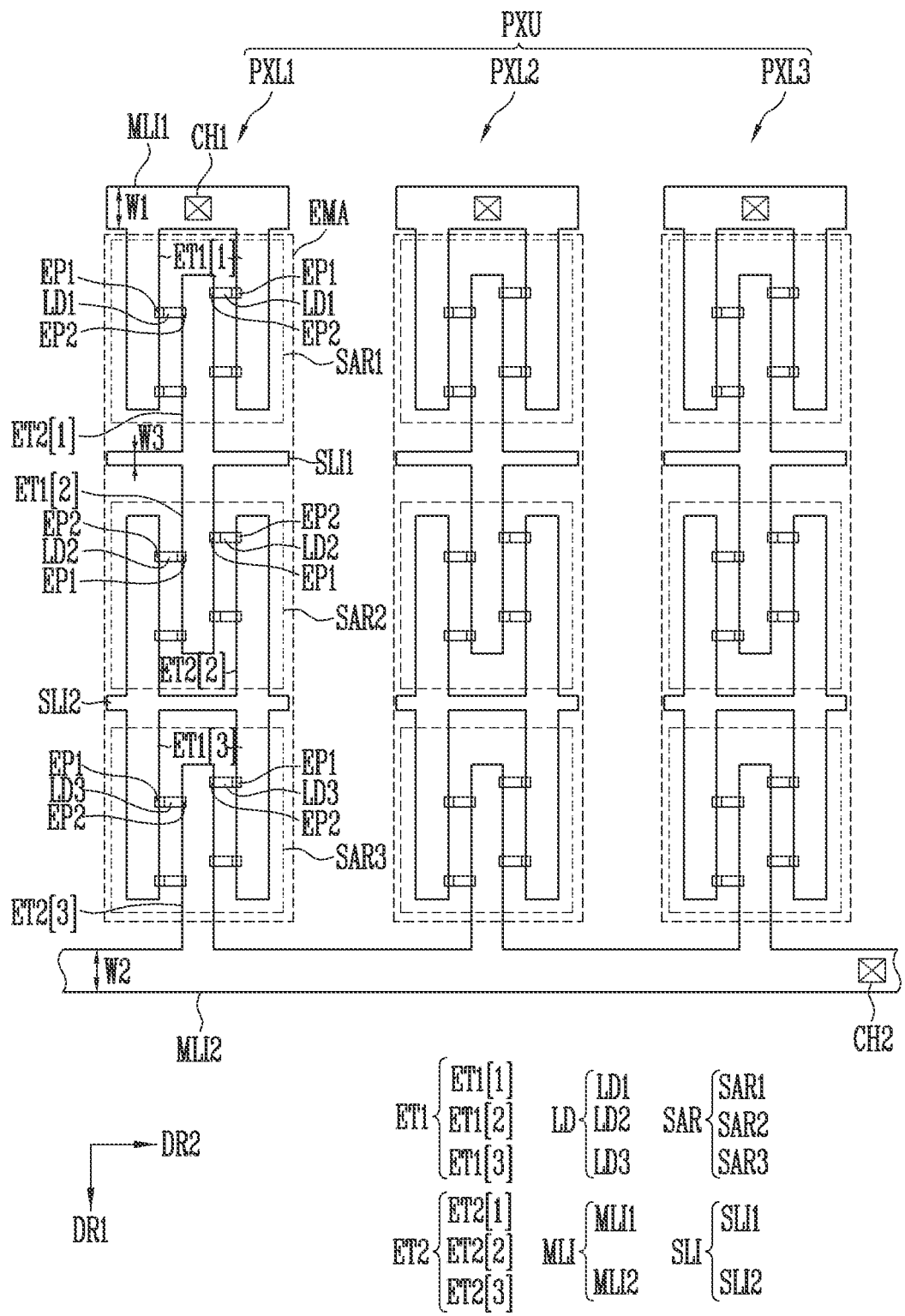
FIGS. 6 and 7 are plan views each illustrating a pixel in accordance with some embodiments of the present disclosure.
Figure 7:
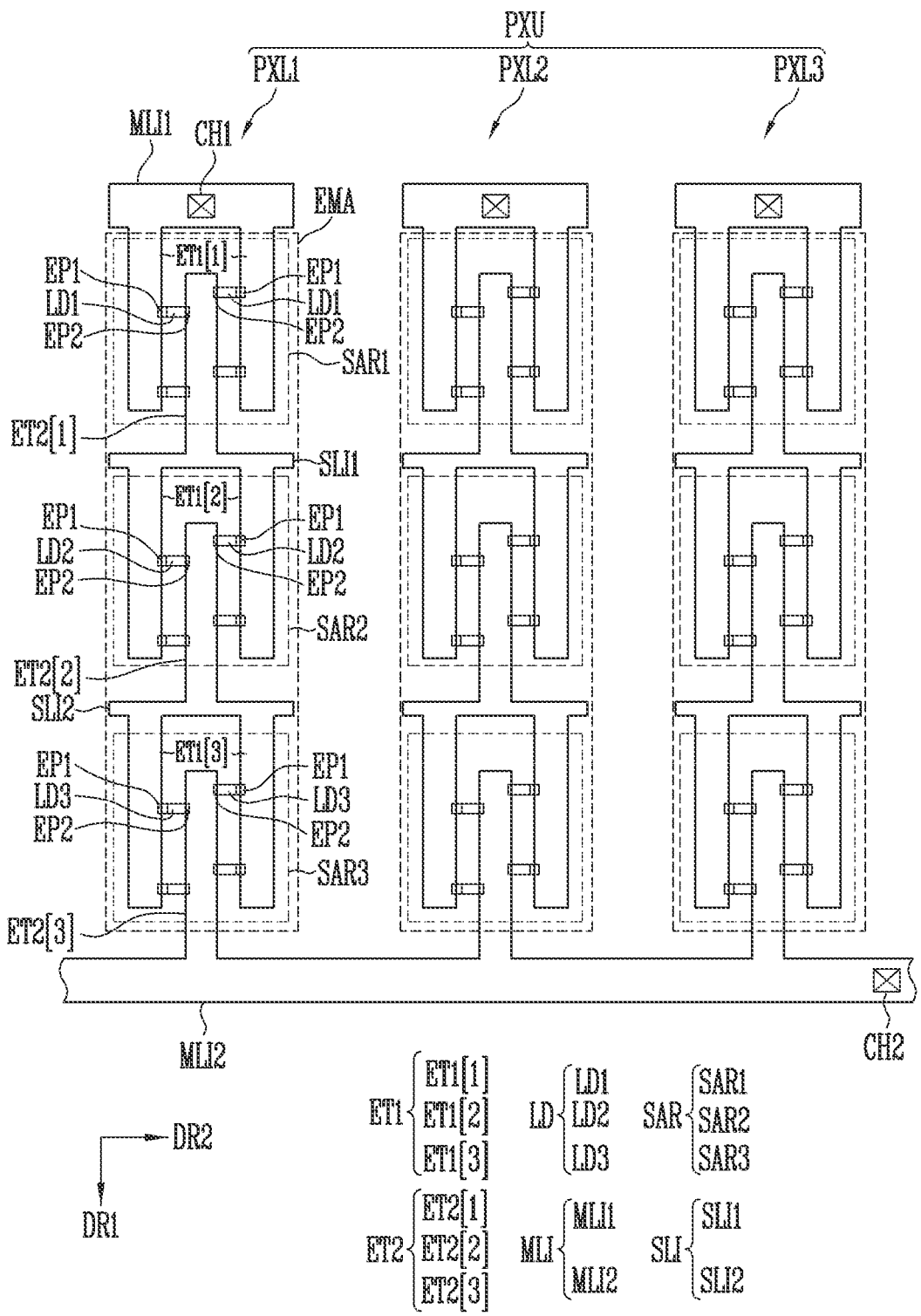

FIGS. 6 and 7 are plan views each illustrating a pixel PXL in accordance with some embodiments of the present disclosure, and for example, FIGS. 6 and 7 illustrate different embodiments of the pixel unit PXU including the first, second, and third pixels PXL1, PXL2, and PXL3 of FIG. 4. For example, FIGS. 6 and 7 illustrate different embodiments pertaining to the shapes and disposition structure of the first and second electrodes ET1 and ET2.

In some embodiments, each pixel PXL illustrated in FIGS. 6 and 7 may be any one of the pixels PXL illustrated in FIGS. 5A to 5E. For example, each of the first, second, and third pixels PXL1, PXL2, and PXL3 illustrated in FIGS. 6 and 7 may be a pixel PXL including a plurality of light emitting elements LD connected in a serial/parallel combination structure, as shown in the embodiments of FIG. 5E.

In some embodiments, the pixels PXL disposed in the display area (DA of FIG. 4) may have substantially identical or similar structures. For example, the first, second, and third pixels PXL1, PXL2, and PXL3 may have substantially the same structure. Therefore, hereinafter, the structure of each pixel PXL will be described based on the first pixel PXL1.

In some embodiments, FIGS. 6 and 7 illustrate the structure of each pixel PXL, centered on the light source unit LSU of the pixel PXL. Here, each pixel PXL may further include a circuit element (e.g., at least one circuit element that forms the pixel circuit PXC of FIGS. 5A to 5E) for controlling each light source unit LSU. In some embodiments, the circuit element may be disposed on a layer that is different from that of the light source unit LSU. For example, the circuit element may be disposed in a pixel circuit layer located on one surface of the base layer (BSL of FIG. 4), and the light source unit LSU may be disposed in a display element layer disposed on the pixel circuit layer.

Furthermore, FIGS. 6 and 7 illustrate some embodiments in which each light source unit LSU is connected, through first and second contact holes CH1 and CH2, to a predetermined power line (e.g., first and/or second power lines PL1 and/or PL2), to a circuit element (e.g., at least one circuit element that forms the pixel circuit PXC), and/or to a signal line (e.g., a scan line Si and/or a data line Dj), but the present disclosure is not limited thereto. For example, in some embodiments of the present disclosure, at least one of the first and second electrodes ET1 and ET2 of each pixel PXL may be directly connected to a predetermined power line and/or to a signal line without using, for example, a contact hole and/or an intermediate line.

Referring to FIGS. 4 to 7, each pixel PXL (e.g., the first pixel PXL1) in accordance with some embodiments of the present disclosure may include a plurality of light emitting elements LD disposed in a plurality of serial stages. For example, each pixel PXL may include first to K-th light emitting elements LD that are respectively provided in the first to K-th (K is a natural number of 2 or more) serial stages. In some embodiments, the first to K-th light emitting elements LD may be respectively disposed in the first to K-th sub-areas. For example, each pixel PXL may include first to K-th sub-areas respectively corresponding to the first to K-th (K is a natural number of 2 or more) serial stages, and first to K-th light emitting elements LD respectively provided in the first to K-th sub-areas.

For example, when the pixel PXL includes a plurality of light emitting elements LD (e.g., first to third light emitting elements LD1 to LD3) that are provided in three serial stages (e.g., a first serial stage, a second serial stage, and a third serial stage) and constitute each light source unit LSU, the pixel PXL may include a first sub-area SAR1 that corresponds to the first serial stage and in which at least one first light emitting element LD1 is disposed, a second sub-area SAR2 that corresponds to the second serial stage and in which at least one second light emitting element LD2 is disposed, and a third sub-area SAR3 that corresponds to the third serial stage and in which at least one third light emitting element LD3 is disposed. Hereinafter, the term "sub-area SAR" or "sub-areas SAR" will be used to arbitrarily designate at least one sub-area of the first, second, and the third sub-areas SAR1, SAR2, and SAR3, or to collectively designate the plurality of sub-areas.

Furthermore, each pixel PXL may include first and second electrodes ET1 and ET2 of each serial stage that are disposed at positions spaced apart from each other in each of the first to K-th sub-areas SAR. For example, each pixel PXL may include first and second electrodes ET1[1] and ET2[1] of the first serial stage that are disposed at positions spaced apart from each other in the first sub-area SAR1, first and second electrodes ET1[2] and ET2[2] of the second serial stage that are disposed at positions spaced apart from each other in the second sub-area SAR2, and first and second electrodes ET1[3] and ET2[3] of the third serial stage that are disposed at positions spaced apart from each other in the third sub-area SAR3.

At least one valid light source may be connected between the first and second electrodes ET1 and ET2 of each serial stage. For example, a plurality of light emitting elements LD may be connected in the forward direction between the first and second electrodes ET1 and ET2 of each serial stage. In other words, in some embodiments, each sub-area SAR may be an area that includes the first and second electrodes ET1 and ET2 that constitute each serial stage, and at least one light emitting element LD electrically connected between the first and second electrodes ET1 and ET2.

In addition, each pixel PXL may further include a plurality of electrode lines. For example, each pixel PXL may further include a first electrode line MLI1 connected to the first electrode of the first serial stage (e.g., the first electrode ET1[1] of the first sub-area SAR1), a second electrode line MLI2 connected to the second electrode of the last serial stage (e.g., the second electrode ET2[3] of the third sub-area SAR3), and at least one intermediate electrode SLI disposed between two successive sub-areas SAR.

In some embodiments, the first to K-th sub-areas SAR (e.g., the first to third sub-areas SAR1 to SAR3) respectively corresponding to the first to K-th serial stages (e.g., the first to third serial stages) may be successively disposed in the emission area EMA of the corresponding pixel PXL. For example, the emission area EMA of each pixel PXL may include first to K-th sub-areas SAR successively disposed in the first direction DR1. In some embodiments, the first direction DR1 may be a vertical direction (or a column direction), but the present disclosure is not limited thereto. For example, in some embodiments, the first direction DR1 may be a horizontal direction (or a row direction). Alternatively, in some embodiments, the first direction DR1 may be a diagonal direction.

For example, if each light source unit LSU includes a plurality of light emitting elements LD that are dispersed in three serial stages, the emission area EMA in which the light source unit LSU is disposed may be sectioned into the three sub-areas SAR with regard to the first direction DR1. In other words, the emission area EMA of each pixel PXL may include a plurality of sub-areas SAR in which the light emitting elements LD and the first and second electrodes ET1 and ET2 of the serial stages that constitute the light source unit LSU of the pixel PXL are disposed. In some embodiments, each emission area EMA may further include an area formed between the sub-areas SAR.

For example, the emission area EMA may include a first sub-area SAR1, a second sub-area SAR2, and a third sub-area SAR3 that are successively disposed in the first direction DR1, and an area formed between the first, second, and third sub-areas SAR1, SAR2, and SAR3 (e.g., an area in which each intermediate electrode SLI is disposed).

In some embodiments, the emission area EMA of each pixel PXL may refer to an area where the light emitting elements LD that form the light source unit LSU of at least corresponding pixel PXL are disposed. The emission area EMA may be defined by a bank structure (also referred to as "pixel defining layer") or the like. For example, a light shielding bank including an opening to expose the emission area EMA of each of the pixels PXL may be disposed between the pixels PXL.

In the first sub-area SAR1 there may be disposed at least one first-serial-stage first electrode ET1[1], at least one first-serial-stage second electrode ET2[1] spaced apart from the first-serial-stage first electrode ET1[1], and at least one first light emitting element (e.g., a plurality of first light emitting elements connected in parallel to each other) LD1 electrically connected between the first-serial-stage first and second electrodes ET1[1] and ET2[1]. Likewise, in the second sub-area SAR2, there may be disposed at least one second-serial-stage first electrode ET1[2], at least one second-serial-stage second electrode ET2[2] spaced apart from the second-serial-stage first electrode ET1[2], and at least one second light emitting element (e.g., a plurality of second light emitting elements connected in parallel to each other) LD2 electrically connected between the second-serial-stage first and second electrodes ET1[2] and ET2[2]. Furthermore, in the case where the pixel PXL further includes a third sub-area SAR3 corresponding to the third serial stage, in the third sub-area SAR3, there may be disposed at least one third-serial-stage first electrode ET1[3], at least one third-serial-stage second electrode ET2[3] spaced apart from the third-serial-stage first electrode ET1[3], and at least one third light emitting element (e.g., a plurality of third light emitting elements connected in pared to each other) LD3 electrically connected between the third-serial-stage first and second electrodes ET1[3] and ET2[3].

The first and second electrodes ET1 and ET2 of each serial stage may be disposed at positions spaced apart from each other in each corresponding sub-area SAR. In some embodiments, the first and second electrodes ET1 and ET2 of the each serial stage may be regularly arranged in each corresponding sub-area SAR, but the present disclosure is not limited thereto.

In some embodiments, the first and second electrodes ET1 and ET2 may have a bar shape extending in any one direction in each sub-area SAR. For example, the first and second electrodes ET1 and ET2 each may have a bar shape extending in the first direction DR1 in the corresponding sub-area SAR, and may be disposed in parallel to each other. For example, the first and second electrodes ET1 and ET2 of each serial stage may extend in the first direction DR1 in each corresponding sub-area SAR and may be successively or alternately disposed at positions spaced apart from each other in the second direction DR2 intersecting with the first direction DR1. In some embodiments, the first and second electrodes ET1 and ET2 may be disposed in each sub-area SAR at regular intervals. Hence, the light emitting elements LD may be more regularly aligned in each sub-area SAR.

However, the shapes, the orientations, and/or the relative disposition structure of the first and second electrodes ET1 and ET2 are not limited thereto and may be changed in various ways. For example, in some embodiments, the first and second electrodes ET1 and ET2 of each serial stage may be disposed at positions spaced apart from each other in a bihelical structure or the like.

Each first electrode ET1 may be electrically connected to the first electrode line (also referred to as "first main electrode line" or "first main alignment line") MLI1 or to the second electrode ET2 of a preceding serial stage. For example, the first electrode ET1[1] of the first serial stage that is the 1st serial stage may be integrally or non-integrally connected to the first electrode line MLI1. In some embodiments, in the case where the first electrode ET1[1] of the first serial stage and the first electrode line MLI1 are integrally connected to each other, the first electrode ET1[1] of the first serial stage and the first electrode line MLI1 may be regarded as different areas of one electrode, line, or pattern.

The first electrode ET1 of each of the other serial stages may be electrically connected to the second electrode ET2 of a preceding serial stage. For example, the first electrode ET1[2] of the second serial stage may be integrally or non-integrally connected to the second electrode ET2[1] of the first serial stage. The first electrode ET1[3] of the third serial stage may be integrally or non-integrally connected to the second electrode ET2[2] of the second serial stage.

Each second electrode ET2 may be electrically connected to the first electrode ET1 of a subsequent serial stage or to the second electrode line (also referred to as "second main electrode line" or "second main alignment line") MLI2. For example, the second electrode ET2[1] of the first serial stage may be connected to the first electrode ET1[2] of the second serial stage. The second electrode ET2[2] of the second serial stage may be connected to the first electrode ET1[3] of the third serial stage. In the case where each light source unit LSU includes only two serial stages, the second electrode ET2[2] of the second serial stage may be integrally or non-integrally connected to the second electrode line MLI2.

The second electrode ET2[3] of the last K-th serial stage, e.g., the third serial stage, may be integrally or non-integrally connected to the second electrode line MLI2. In some embodiments, in the case where the second electrode ET2[3] of the third serial stage and the second electrode line MLI2 are integrally connected to each other, the second electrode ET2[3] of the third serial stage and the second electrode line MLI2 may be regarded as different areas of one electrode, line, or pattern.

In some embodiments, the first and second electrodes ET1 and ET2 may be disposed in a regular pattern in each emission area EMA. Furthermore, the respective numbers of first and second electrodes ET1 and ET2 disposed in each sub-area SAR are not particularly limited. For example, each sub-area SAR may include one or more first and second electrodes ET1 and ET2, and the respective numbers of first and second electrodes ET1 and ET2 may be identical with or different from each other.

In some embodiments, as illustrated in FIG. 6, the first and second electrodes ET1 and ET2 may be disposed in two successive sub-areas SAR in a shape in which the first and second electrodes ET1 and ET2 are symmetrical with each other based on the intermediate electrode SLI disposed between the two sub-areas SAR. For example, in the first sub-area SAR1, two first-serial-stage first electrodes ET1[1] may be disposed, and one first-serial-stage second electrode ET2[1] that is parallel to the first-serial-stage first electrodes ET1[1] may be disposed between the first-serial-stage first electrodes ET1[1]. In the second sub-area SAR2, one second-serial-stage first electrode ET1[2] integrally connected to the one first-serial-stage second electrode ET2[1] may be disposed to be symmetrical with the first-serial-stage second electrode ET2[1] based on the first intermediate electrode SLI1 disposed between the first and second sub-areas SAR1 and SAR2, and two second-serial-stage second electrodes ET2[2] may be disposed on opposite sides of one second-serial-stage first electrode ET1[2] such that the two second-serial-stage second electrodes ET2[2] are symmetrical with the two first-serial-stage first electrodes ET1[1] based on the first intermediate electrode SLI1. Likewise, in the third sub-area SAR3, two third-serial-stage first electrodes ET1[3] integrally connected to the two second-serial-stage second electrodes ET2[2] may be disposed to be symmetrical with the two second-serial-stage second electrodes ET2[2] based on a second intermediate electrode SLI2 disposed between the second and third sub-areas SAR2 and SAR3, and one third-serial-stage second electrode ET2[3] may be disposed between the two third-serial-stage first electrodes ET1[3] such that the one third-serial-stage second electrode ET2[3] is symmetrical with the one second-serial-stage first electrode ET1[2] based on the second intermediate electrode SLI2.

In some embodiments, the first and second electrodes ET1 and ET2 may be disposed in each sub-area SAR in the same repetitive pattern, as illustrated in FIG. 7. For example, in each of the first to third sub-areas SAR1 to SAR3, two first electrodes ET1 may be disposed, and one second electrode ET2 may be disposed between the two first electrodes ET1 such that the second electrode ET2 is parallel with the first electrodes ET1. In other words, the shapes and the disposition structure of the first and second electrodes ET1 and ET2 may be changed in various ways depending on embodiments.

At least one light emitting element LD, e.g., a plurality of light emitting elements LD, may be connected between the first and second electrodes ET1 and ET2 of each serial stage. For example, a plurality of first light emitting elements LD1 may be connected in parallel between the first and second electrodes ET1[1] and ET2[1] of the first serial stage. Likewise, a plurality of second light emitting elements LD2 may be connected in parallel between the first and second electrodes ET1[2] and ET2[2] of the second serial stage, and a plurality of third light emitting elements LD3 may be connected in parallel between the first and second electrodes ET1[3] and ET2[3] of the third serial stage.

In some embodiments, each of the light emitting elements LD may be a light emitting element that is made of material having an inorganic crystal structure and has a subminiature size, e.g., ranging from the nanometer scale to the micrometer scale. For example, each light emitting element LD may be a subminiature rod-type light emitting element having a size ranging from the nanometer scale to the micrometer scale, as illustrated in FIGS. 1A to 3B. The size, the type, the shape, etc. of the light emitting elements LD may be changed in various ways.

Although FIGS. 6 and 7 illustrate that, in the area where a pair of first and second electrodes ET1 and ET2 are disposed to face each other, each light emitting element LD is uniformly horizontally arranged in the second direction DR2 between the first and second electrodes ET1 and ET2, the present disclosure is not limited thereto. For example, at least one of the light emitting elements LD may be arranged and/or connected in a diagonal direction between the first and second electrodes ET1 and ET2. Alternatively, although not illustrated in FIGS. 6 and 7, at least one light emitting element (e.g., an invalid light source other than a reverse light emitting element LDrv) that is not completely connected between the first and second electrodes ET1 and ET2 may be further disposed in each sub-area SAR and/or an area provided around the sub-area SAR.

In some embodiments, the light emitting elements LD may be prepared in a diffused form in a predetermined solution, and then may be supplied to the emission area EMA of each pixel PXL by an inkjet scheme or the like. For example, the light emitting elements LD may be mixed with a volatile solvent and supplied to each emission area EMA. Here, if alignment signals/predetermined alignment signals (or alignment voltages) are applied to the first and second electrodes ET1 and ET2, an electric field is formed between the first and second electrodes ET1 and ET2, whereby the light emitting elements LD may be aligned between the first and second electrodes ET1 and ET2. After the light emitting elements LD have been aligned, the solvent may be removed by a volatilization scheme or other schemes. In this way, the light emitting elements LD may be reliably disposed between the first and second electrodes ET1 and ET2.

Each light emitting element LD may include a first end EP1 connected to the first electrode ET1 of the corresponding serial stage, and a second end EP2 connected to the second electrode ET2 of the corresponding serial stage. In some embodiments, the first end EP1 may be a P-type end, and the second end EP2 may be an N-type end.

In some embodiments, each light emitting element LD may be connected in the forward direction between the first and second electrodes ET1 and ET2 of each serial stage. For example, the first end EP1 of each of the light emitting elements LD may be directly connected to the first electrode ET1 of any one serial stage, or may be connected to the first electrode ET1 of the any one serial stage through at least one contact electrode. Likewise, the second end EP2 of each of the light emitting elements LD may be directly connected to the second electrode ET2 of any one serial stage, or may be connected to the second electrode ET2 of the any one serial stage through at least one contact electrode. The light emitting elements LD connected in the forward direction between the first and second electrodes ET1 and ET2 of each serial stage may form valid light sources of the corresponding serial stage.

Although not shown in FIGS. 6 and 7, at least one serial stage may further include at least one reverse light emitting element (LDrv of FIGS. 5A to 5E) connected between the first and second electrodes ET1 and ET2 in a direction (e.g., in a reverse direction) that is opposite to that of the light emitting elements LD constituting the respective valid light sources. For example, at least one sub-area SAR may include at least one reverse light emitting element LDrv connected in the reverse direction between the first and second electrodes ET1 and ET2. The at least one reverse light emitting element LDrv may remain disabled in the pixel PXL.

The first electrode line MLI1 may be supplied with a voltage of the first power supply VDD (e.g., the first power voltage) or a first driving signal (e.g., a scan signal, a data signal, or a predetermined other control signal) during a period in which the display device is operated. In some embodiments, the first electrode line MLI1 may be electrically connected to a first contact hole CH1, a predetermined circuit element (e.g., at least one transistor that forms the pixel circuit PXC), a power line (e.g., the first power line PL1), and/or a signal line (e.g., the scan line Si, the data line Dj, or a predetermined control line). For example, the first electrode line MLI1 may be electrically connected to a predetermined circuit element disposed thereunder through the first contact hole CH1, and may be connected to the first power line PL1 through the circuit element. For example, each pixel PXL may further include a pixel circuit PXC connected between the first electrode line MLI1 and the first power supply VDD. In some embodiments, the pixel circuit PXC may be disposed under each light source unit LSU and may be connected to the first electrode line MLI1 of the light source unit LSU through the first contact hole CH1. In some embodiments, the first electrode line MLI1 may be connected, via the first contact hole CH1, etc., to a signal line to which a predetermined first driving signal is supplied. In some embodiments, the first electrode line MLI1 may be directly connected to the first power line PL1 or to a predetermined signal line without using the first contact hole CH1, and/or to the circuit element. In this case, the first electrode line MLI1 may be integrally or non-integrally connected to the first power line PL1 or to the predetermined signal line.

In some embodiments, the first electrode line MLI1 connected to the first-serial-stage first electrodes ET1[1] of each of the pixels PXL may be first fabricated to be connected in common to a plurality of pixels PXL and may be supplied with a first alignment signal (or a first alignment voltage) at the step of aligning the light emitting elements LD. Thereafter, the first electrode line MLI1 between the pixels PXL may be open, so that the pixels PXL can be fabricated to be individually operable. For example, the first electrode line MLI1 may be open between the first and second pixels PXL1 and PXL2 adjacent to each other, between the second and third pixels PXL2 and PXL3 adjacent to each other, and between the pixel units PXU adjacent to each other, so that the respective pixels PXL may be separated from each other to be individually operable. In other words, in some embodiments, the first electrode lines MLI1 of the pixels PXL may be separated from each other between the adjacent pixels PXL.

The second electrode line MLI2 may be supplied with a voltage of the second power supply VSS (e.g., the second power voltage) or a second driving signal (e.g., a scan signal, a data signal, or a predetermined other control signal) during a period in which the display device is operated. In some embodiments, the second electrode line MLI2 may be electrically connected to a second contact hole CH2, to a predetermined circuit element (e.g., at least one transistor that forms the pixel circuit PXC), to a power line (e.g., the second power line PL2), and/or to a signal line (e.g., the scan line Si, the data line Dj, or a predetermined control line). For example, the second electrode line MLI2 may be connected, through the second contact hole CH2, to the second power line PL2 disposed thereunder. In some embodiments, the second electrode line MLI2 may be directly connected to the second power line PL2 or to a predetermined signal line without using, for example, the second contact hole CH2, and/or to the circuit element. In this case, the second electrode line MLI2 may be integrally or non-integrally connected to the second power line PL2 or to the predetermined signal line.

In some embodiments, the second electrode line MLI2 connected to the second electrodes ET2[3] of the last serial stage of each of the pixels PXL, e.g., the third serial stage, may be connected in common to a plurality of pixels PXL. For example, the second electrode lines MLI2 of the first, second, and third pixels PXL1, PXL2, and PXL3 may be integrally connected to each other. In some embodiments, the second electrode lines MLI2 of a plurality of pixel units PXU may be integrally connected to each other.

The second electrode line MLI2 may be supplied with a predetermined second alignment signal (or a second alignment voltage) at the step of aligning the light emitting elements LD. During a period in which the display device is actually driven, the second electrode line MLI2 may be supplied with the voltage of the second power supply VSS or a predetermined second driving signal.

In some embodiments, the first and second electrode lines MLI1 and MLI2 may be disposed to face each other with first to K-th sub-areas SAR (e.g., the first to third sub-areas SAR1 to SAR3) of each pixel PXL interposed therebetween. For example, the first electrode line MLI1 of each pixel PXL may be disposed adjacent to the first sub-area SAR1 and connected to the first electrode ET1[1] of the first serial stage disposed in the first sub-area SAR1. The second electrode line MLI2 of each pixel PXL may be disposed adjacent to the last sub-area SAR, e.g., the third sub-area SAR3, and connected to the second electrode ET2[3] of the third serial stage that is disposed in the third sub-area SAR3. For example, the first and second electrode lines MLI1 and MLI2 of each pixel PXL may be respectively disposed over the first sub-area SAR1 and under the third sub-area SAR3 and respectively electrically connected to the first electrode ET1[1] of the first sub-area SAR1 and the second electrode ET2[3] of the third sub-areas SAR3.

For example, the first and second electrode lines MLI1 and MLI2 may be disposed in parallel to each other with the first to K-th sub-areas SAR of each pixel PXL interposed therebetween. For example, each of the first and second electrode lines MLI1 and MLI2 may extend in the second direction DR2 intersecting with the first direction DR1 in which the first and second electrodes ET1 and ET2 each extend. For example, each of the first and second electrode lines MLI1 and MLI2 may extend in a direction that is perpendicular to the direction in which the first and second electrodes ET1 and ET2 each extend. In some embodiments, the second direction DR2 may be a horizontal direction (or a row direction), but the present disclosure is not limited thereto. For example, in some embodiments, the second direction DR2 may be a vertical direction (or a column direction). Alternatively, in some embodiments, the second direction DR2 may be a diagonal direction.

The electrode lines MLI of each pixel PXL including the first and second electrode lines MLI1 and MLI2 may be main alignment lines that are supplied with alignment signals to be applied to each light source unit LSU at the step of aligning the light emitting elements LD in each pixel PXL to fabricate the display device and are disposed on a path along which alignment current corresponding to the alignment signal flows. Furthermore, the electrode lines MLI may be main driving/power lines that are supplied with predetermined driving voltages to be applied to each light source unit LSU in response to a data signal of each frame at the step of driving the display device (e.g., when in use) and are disposed on a path along which driving current of each pixel PXL flows.

Each intermediate electrode SLI may be electrically connected to both the second electrode ET2 disposed in a preceding sub-area SAR of two successive sub-areas SAR and the first electrode ET1 disposed in a subsequent sub-area SAR. For example, in the case where each pixel PXL includes a light source unit LSU formed of three serial stages, the pixel PXL may include a first intermediate electrode SLI1 that is disposed between the first and second sub-areas SAR1 and SAR2 and that is electrically connected to the second electrode ET2[1] of the first sub-area SAR1 and the first electrode ET1[2] of the second sub-area SAR2, and a second intermediate electrode SLI2 that is disposed between the second and third sub-areas SAR2 and SAR3 and that is electrically connected to the second electrode ET2[2] of the second sub-area SAR2 and the first electrode ET1[3] of the third sub-area SAR3.

In some embodiments, each intermediate electrode SLI may be integrally connected to the second electrode ET2 of the preceding sub-area SAR, and to the first electrode ET1 of the subsequent sub-area SAR. In this case, at the step of forming the first and second electrodes ET1 and ET2 of each serial stage, the intermediate electrodes SLI may be concurrently formed between the serial stages. Hence, each intermediate electrode SLI may be formed between successive serial stages without a separate additional process of forming the intermediate electrodes SLI. According to the foregoing embodiments, a process of fabricating the pixel PXL and the display device including the pixel PXL may be simplified, and the fabricating efficiency thereof may be enhanced.

In some embodiments, each intermediate electrode SLI may be disposed between the first and second electrode lines MLI1 and MLI2 and may be spaced apart from each of the first and second electrode lines MLI1 and MLI2 with at least one sub-area SAR interposed therebetween. For example, the first and second electrode lines MLI1 and MLI2 of each pixel PXL and at least one intermediate electrode SLI may be disposed in parallel to each other with at least one sub-area SAR interposed between respective ones thereof.

For example, in the same manner as the first and second electrode lines MLI1 and MLI2, each intermediate electrode SLI may extend in a direction intersecting with the direction in which the first and second electrodes ET1 and ET2 extend. For example, each intermediate electrode SLI may extend in the second direction DR2 between two successive sub-areas SAR.

In some embodiments, the intermediate electrodes SLI of each serial stage may be formed in the form of being connected in common to a plurality of pixels PXL and may be supplied with intermediate-stage alignment signals (or intermediate alignment voltages) at the step of aligning the light emitting elements LD. For example, the first intermediate electrode SLI1 of the first pixel PXL1 may be formed in the form of being connected in common with the first intermediate electrodes SLI1 of the second and third pixels PXL2 and PXL3 and may be supplied with a first-intermediate-stage alignment signal (or a first intermediate alignment voltage) at the step of aligning the light emitting elements LD. The second intermediate electrode SLI2 of the first pixel PXL1 may be formed in the form of being connected in common with the second intermediate electrodes SLI2 of the second and third pixels PXL2 and PXL3 and may be supplied with a second-intermediate-stage alignment signal (or a second intermediate alignment voltage) at the step of aligning the light emitting elements LD.

In other words, the intermediate electrodes SLI may be formed to directly apply an alignment voltage/a predetermined alignment voltage between successive serial stages at the step of aligning the light emitting elements LD. Thanks to the intermediate electrodes SLI, an alignment signal may be applied to the light source unit LSU of each pixel PXL using a serial structure even at the step of aligning the light emitting elements LD. Hence, alignment current that flows through the display panel PNL may be reduced, so that the efficiency of energy (power) needed when the light emitting elements LD are aligned can be improved.

Since alignment current that flows through the first and second electrode lines MLI1 and MLI2 is reduced, a voltage drop (IR drop) that occurs in the first and second electrode lines MLI1 and MLI2 is reduced, so that a line width of the first and/or second electrode lines MLI1 and/or MLI2 may be reduced. Furthermore, the capacity of an amplifier of a power supply (not shown) for applying alignment signals may be reduced.

In addition, in the case where the intermediate electrodes SLI are formed so that the light emitting elements LD may be biased-aligned between the first and second electrodes ET1 and ET2 while an alignment voltage is applied between the serial stages, at the step of aligning the light emitting elements LD during a process of fabricating the display device, a direction of alignment voltage/current to be applied to the first and second electrodes ET1 and ET2 may match with a direction of driving voltage/current to be applied to the first and second electrodes ET1 and ET2 at the step of actually driving the display device. Therefore, when the display device is actually driven, the light emitting elements LD may be biased-aligned in a direction corresponding to the forward direction. In accordance with some embodiments of the present disclosure, the number of light emitting elements LD connected in the forward direction between the first and second electrodes ET1 and ET2 of each pixel PXL may be increased. Therefore, the light emitting elements LD supplied to the emission area EMA of each pixel PXL may be efficiently used to form each light source unit LSU.

With the exception of a junction at which respective first and second electrodes ET1 and ET2 are connected in series between respective serial stages, each intermediate electrode SLI may not form a substantial current path, unlike the first and second electrode lines MLI1 and MLI2. Therefore, each intermediate electrode SLI may be formed to have a width that is less than that of the first and second electrode lines MLI1 and MLI2. For example, when the first electrode line MLI1 and the second electrode line MLI2 respectively have a first width W1 and a second width W2, each intermediate electrode SLI may have a third width W3 that is less than each of the first width W1 and the second width W2. In some embodiments, the first width W1 and the second width W2 may be identical with or different from each other. In the case where the width of each intermediate electrode SLI is reduced, the capacity of the amplifier of the power supply for applying an alignment signal may be further reduced at the step of aligning the light emitting elements LD.

After the alignment of the light emitting elements LD has been completed, the intermediate electrodes SLI between the pixels PXL may be disconnected and separated. For example, the intermediate electrodes SLI of the respective serial stages may be disconnected from each other between the first and second pixels PXL1 and PXL2 adjacent to each other, between the second and third pixels PXL2 and PXL3 adjacent to each other, and between the pixel units PXU adjacent to each other. Hence, the pixels PXL may be separated to be capable of being individually controlled.

In the descriptions of the embodiments of FIGS. 6 and 7, although in the foregoing explanation the first and second electrodes ET1 and ET2 have been described as being separate components by respective serial stages, at least two electrodes disposed in a plurality of serial stages may be regarded as different areas of a single electrode in the overall viewpoint pertaining to the electrodes of each pixel PXL. For example, the second electrode ET2[1] of the first serial stage, the first intermediate electrode SLI1, and the first electrode ET1[2] of the second serial stage that are integrally connected to each other may be regarded as a first electrode part, a second electrode part, and a third electrode part of a single electrode (e.g., referred to as "second electrode"). Likewise, the second electrode ET2[2] of the second serial stage, the second intermediate electrode SLI2, and the first electrode ET1[3] of the third serial stage that are integrally connected to each other may be regarded as a first electrode part, a second electrode part, and a third electrode part of another single electrode (e.g., referred to as "third electrode").

With this respect, the structures of the electrodes disposed in the emission area EMA of each pixel PXL will be explained. Each pixel PXL may include: at least one first electrode (e.g., the first electrode ET1[1] of the first serial stage) that is electrically connected to the first electrode line MLI1 and that extends in the first direction DR1; at least one second electrode that includes first and third electrode parts (e.g., the second electrode ET2[1] of the first serial stage and the first electrode ET1[2] of the second serial stage) spaced apart from the first electrode and each extending in the first direction DR1, and a second electrode part (e.g., the first intermediate electrode SLI1) extending in the second direction DR2 between the first and third electrodes; and at least one third electrode (e.g., at least the second electrode ET2[2] of the second serial stage) spaced apart from the first and second electrodes, at least one area of which extending in the first direction DR1. Furthermore, each pixel PXL may include at least one first light emitting element LD1 electrically connected between the first electrode and the second electrode, and at least one second light emitting element LD2 electrically connected between the second electrode and the third electrode.

In some embodiments, the first electrode part (the second electrode ET2[1] of the first serial stage) of the second electrode may extend in the first direction DR1 and may be spaced apart from the first electrode (the first electrode ET1[1] of the first serial stage) with respect to a direction (e.g., the second direction DR2) intersecting with the first direction DR1. For example, the first electrode part of the second electrode may be disposed in parallel to the first electrode.

In some embodiments, the second electrode part (the first intermediate electrode SLI1) of the second electrode may extend from the first electrode part (e.g., a lower end area of the first electrode part) in the second direction DR2. In some embodiments, the second electrode part of the second electrode may be disposed at a position spaced apart from the first and third electrodes between the first electrode and the third electrode, but the present disclosure is not limited thereto.

In some embodiments, the third electrode part (the first electrode ET1[2] of the second serial stage) of the second electrode may extend from the second electrode part in the first direction DR1. In some embodiments, the first and third electrode parts of the second electrode may be disposed on a line along the first direction DR1, but the present disclosure is not limited thereto. For example, as illustrated in FIG. 6, the first and third electrode parts of the second electrode each may have a structure extending in a line along the first direction DR1. In some embodiments, the first and third electrode parts of the second electrode each may extend in the first direction DR1 while not being disposed on a line. For example, as illustrated in FIG. 7, the first and third electrode parts of the second electrode each may be bent or offset with respect to a junction with the second electrode part.

Likewise, the third electrode may include first and third electrode parts (e.g., the second electrode ET2[2] of the second serial stage and the first electrode ET1[3] of the third serial stage) that are spaced apart from the first and second electrodes and that each extend in the first direction DR1, and a second electrode part (e.g., the second intermediate electrode SLI2) extending in the second direction between the first and third electrode parts. However, in the case where each pixel PXL includes only two serial stages, the third electrode may include only the first electrode part and/or the second electrode part.

In some embodiments, the first electrode part (the second electrode ET2[2] of the second serial stage) of the third electrode may extend in the first direction DR1 and may be spaced apart from the third electrode part of the second electrode (the first electrode ET1[2] of the second serial stage) with respect to a direction (e.g., the second direction DR2) intersecting with the first direction DR1. For example, the first electrode part of the third electrode may be disposed in parallel to the third electrode part of the second electrode.

In some embodiments, the second electrode part (the second intermediate electrode SLI2) of the third electrode may extend from the first electrode part (e.g., the lower end area of the first electrode part) in the second direction DR2. In some embodiments, the second electrode part of the third electrode may be disposed at a position spaced apart from the second electrode and a fourth electrode (e.g., the second electrode ET2[3] of the third serial stage) between the second electrode and the fourth electrode, but the present disclosure is not limited thereto.

In some embodiments, the third electrode part (the first electrode ET1[3] of the third serial stage) of the third electrode may extend from the second electrode part in the direction DR1. In some embodiments, the first and third electrode parts of the third electrode may be disposed on a line along the first direction DR1, but the present disclosure is not limited thereto. For example, as illustrated in FIG. 6, the first and third electrode parts of the third electrode each may have a structure extending in a line along the first direction DR1. In some embodiments, the first and third electrode parts of the third electrode each may extend in the first direction DR1 while not being disposed on a line. For example, as illustrated in FIG. 7, the first and third electrode parts of the third electrode each may be bent or offset with respect to a junction with the second electrode part.

The third electrode may be electrically connected to the second electrode line MLI2. In some embodiments, in the case where each pixel PXL includes only two serial stages, the third electrode may be directly connected to the second electrode line MLI2. In some embodiments, in the case where each pixel PXL includes three or more serial stages, at least one electrode and/or light emitting element may be connected between the third electrode and the second electrode line MLI2. For example, each pixel PXL may further include at least one third light emitting element LD3 that is electrically connected between the third electrode and the second electrode line MLI2, and a fourth electrode (e.g., the second electrode ET2[3] of the third serial stage) that is electrically connected between the third light emitting element LD3 and the second electrode line MLI2.

In some embodiments, at least one area of the first electrode and at least one area of the third electrode may be disposed at positions spaced apart from each other on a line. For example, as illustrated in FIG. 6, the first electrode and the first electrode part of the third electrode may be disposed on a line along the first direction DR1 and may be disposed at positions spaced apart from each other with the second electrode part of the second electrode interposed therebetween. In this case, the first and third electrode parts of the second electrode may be disposed on a line along the first direction DR1. For example, the first and third electrode parts of the second electrode may be respectively spaced apart from the first electrode and the first electrode part of the third electrode by the same distance in the second direction DR2. The shapes, structures, and/or relative disposition relationship of the electrodes disposed in each pixel PXL may be changed depending on embodiments.

For example, in some embodiments, as illustrated in FIG. 7, the first electrode and the third electrode part of the second electrode may be disposed at positions spaced apart from each other on a line along the first direction DR1. In this case, the first electrode part of the second electrode and at least one area of the third electrode (e.g., the first electrode part of the third electrode) may be disposed at positions spaced apart from each other on a line.

At least one first light emitting element LD1 may be electrically connected between the first electrode and the second electrode. At least one second light emitting element LD2 may be electrically connected between the second electrode and the third electrode. Furthermore, in the case where each pixel PXL further includes a fourth electrode, at least one third light emitting element LD3 may be electrically connected between the third electrode and the fourth electrode.

In some embodiments, the first light emitting element LD1 may be connected between the first electrode and the first electrode part of the second electrode. The second light emitting element LD2 may be connected between the third electrode part of the second electrode and the first electrode part of the third electrode. Likewise, the third light emitting element LD3 may be connected between the third electrode part of the third electrode and the fourth electrode.

The first light emitting element LD1 may be connected in the forward direction between the first electrode and the second electrode. For example, a first end (e.g., a P-type end) EP1 of the first light emitting element LD1 may be electrically connected to the first electrode. A second end (e.g., an N-type end that is opposite to the P-type end) EP2 of the first light emitting element LD1 may be electrically connected to the second electrode.

Likewise, the second light emitting element LD2 may be connected in the forward direction between the second electrode and the third electrode. The third light emitting element LD3 may be connected in the forward direction between the third electrode and the fourth electrode. For example, a first end (e.g., a P-type end) EP1 of the second light emitting element LD2 may be electrically connected to the second electrode. A second end (e.g., an N-type end that is opposite to the P-type end) EP2 of the second light emitting element LD2 may be electrically connected to the third electrode. In addition, a first end (e.g., a P-type end) EP1 of the third light emitting element LD3 may be electrically connected to the third electrode. A second end (e.g., an N-type end that is opposite to the P-type end) EP2 of the third light emitting element LD3 may be electrically connected to the fourth electrode.

In other words, depending on viewpoint, respective electrodes and/or electrode parts may be designated by different names or terms. Furthermore, a plurality of electrodes or electrode parts, etc. that are integrally or non-integrally connected to each other may be regarded as a single element or separate elements that are separated from each other. Therefore, the structures of the pixels PXL in accordance with embodiments of the present disclosure may be interpreted in terms of each sub-area SAR or pixel PXL in a small sense, or interpreted in terms of each pixel unit PXU or display area DA in a broad sense.

Figure 8:
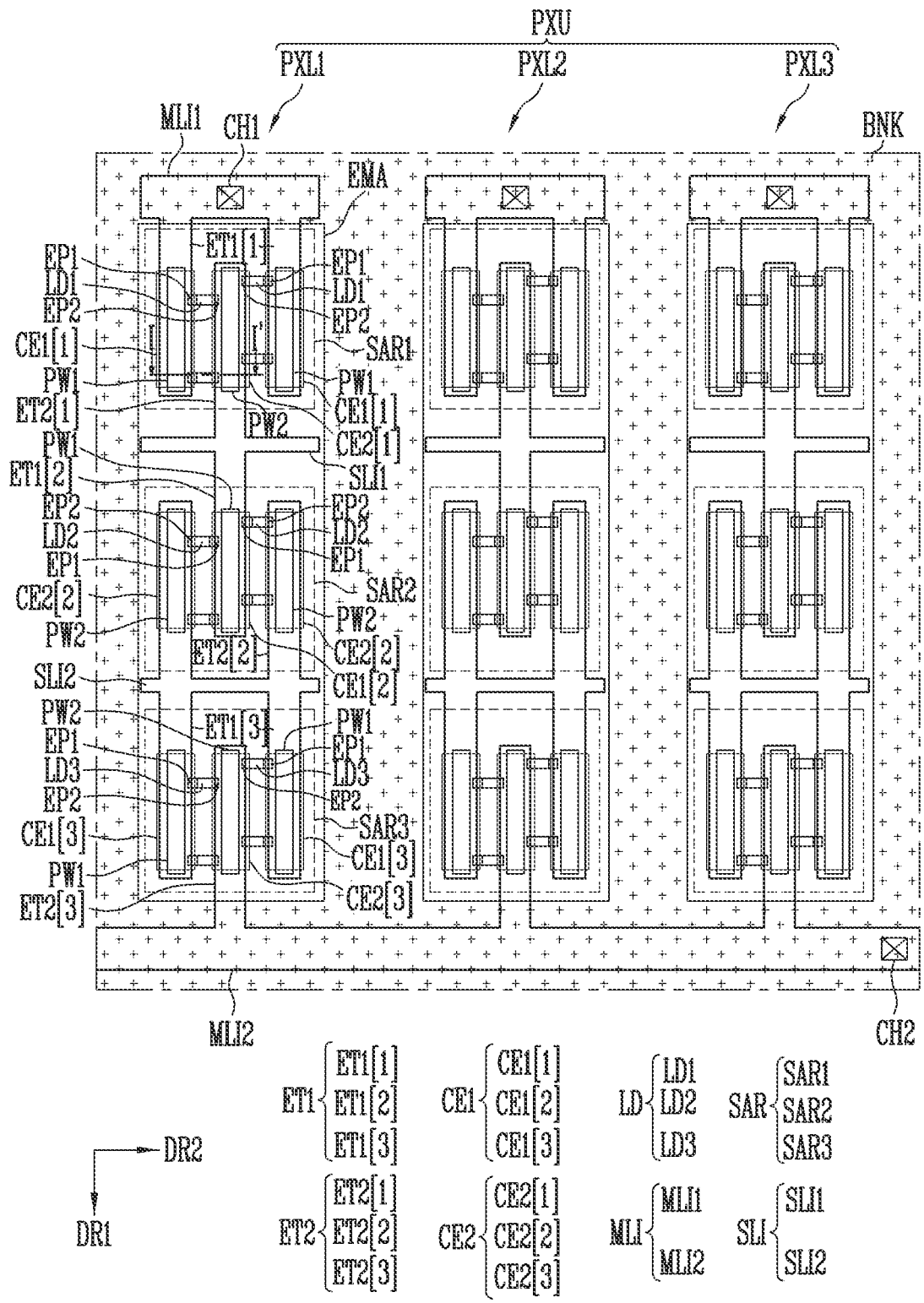

FIGS. 8 to 9 are plan views each illustrating a pixel PXL in accordance with some embodiments of the present disclosure, and for example illustrate modified embodiments pertaining to the embodiments of FIGS. 6 and 7, respectively. In the description of the embodiments of FIGS. 8 and 9, repeated detailed explanation of configurations similar or identical to those of FIGS. 6 and 7 will be omitted.

Referring to FIGS. 8 and 9, each pixel PXL may selectively further include first contact electrodes CE1 and second contact electrodes CE2 that are respectively disposed over the first electrodes ET1 and the second electrode ET2. For example, each first-serial-stage first contact electrode CE1[1] may be disposed on each corresponding first-serial-stage first electrode ET1[1]. Each first-serial-stage second contact electrode CE2[1] may be disposed on each corresponding first-serial-stage second electrode ET2[1]. Likewise, each second-serial-stage first contact electrode CE1[2] may be disposed on each corresponding second-serial-stage first electrode ET1[2]. Each second-serial-stage second contact electrode CE2[2] may be disposed on each corresponding second-serial-stage second electrode ET2[2]. Each third-serial-stage first contact electrode CE1[3] may be disposed on each corresponding third-serial-stage first electrode ET1[3]. Each third-serial-stage second contact electrode CE2[3] may be disposed on each corresponding third-serial-stage second electrode ET2[3].

In some embodiments, the first contact electrodes CE1 may be formed to have individual patterns respectively over the first electrodes ET1 of each serial stage. The first contact electrodes CE1 may electrically connect each first electrode ET1 with the first end EP1 of at least one light emitting element LD adjacent to the first electrode ET1.

Likewise, the second contact electrodes CE2 may be formed to have individual patterns respectively over the second electrodes ET2 of each serial stage. The second contact electrodes CE2 may electrically connect each second electrode ET2 with the second end EP2 of at least one light emitting element LD adjacent to the second electrode ET2.

Since the first and second contact electrodes CE1 and CE2 are formed, the light emitting elements LD may be more reliably connected between the first and second electrodes ET1 and ET2.

Furthermore, each pixel PXL may selectively further include first partition walls PW1 (also referred to as "first walls" or "first banks") and second partition walls PW2 (also referred to as "second walls" or "second banks") that are respectively disposed under the first electrodes ET1 and the second electrodes ET2.

In some embodiments, the first partition walls PW1 may be disposed to have individual patterns respectively under the first electrodes ET1 of each serial stage. If the first partition walls PW1 are disposed under the first electrodes ET1, the first electrodes ET1 may protrude upward in the area in which the first partition walls PW1 are disposed. Therefore, light emitted from the first ends EP1 of the light emitting elements LD that face the first electrodes ET1 may be controlled to more effectively travel in the frontal direction of the display device.

Likewise, the second partition walls PW2 may be disposed to have individual patterns respectively under the second electrodes ET2 of each serial stage. If the second partition walls PW2 are disposed under the second electrodes ET2, the second electrodes ET2 may protrude upward in the area in which the second partition walls PW2 are disposed. Therefore, light emitted from the second ends EP2 of the light emitting elements LD that face the second electrodes ET2 may be controlled to more effectively travel in the frontal direction of the display device.

Furthermore, the display device may further include a bank BNK that defines and/or separates the emission area EMA of each pixel PXL. For example, the bank BNK may be disposed between the emission areas EMA of the pixels PXL to integrally enclose each emission area EMA including the sub-areas SAR of each pixel PXL. For example, the bank BNK may include a plurality of openings corresponding to the respective emission areas EMA of the pixels PXL and may be formed in the display area DA in a mesh shape. In some embodiments, the bank BNK may include light shielding and/or reflective opaque material, so that light leakage may be prevented from occurring between adjacent pixels PXL.

In accordance with the embodiments illustrated in FIGS. 6 to 9, light emitting elements LD supplied to the emission area EMA of each pixel PXL may be connected at least in a serial structure. For example, the light emitting elements LD supplied to the emission area EMA of each pixel PXL may be connected in a serial/parallel combination structure to form each light source unit LSU. Hence, not only may each pixel PXL be reliably driven, but driving current flowing through the display panel PNL may also be reduced. Therefore, the power consumption efficiency may be improved.

Furthermore, since each intermediate electrode SLI is formed between successive serial stages, alignment/driving signals may be supplied to the light emitting elements LD in a state in which the light emitting elements LD are connected in a serial/parallel combination structure. Hence, the power consumption efficiency when in operation may be improved, and the efficiency of power that is used to align the light emitting elements LD may be improved. Compared to some embodiments in which all of the light emitting elements LD of each light source unit LSU are connected in parallel, the line widths of the first and second electrode lines MLI1 and MLI2 may be reduced, and the capacity of the amplifier of the power supply for supplying an alignment signal may be reduced.

In addition, since each intermediate electrode SLI is formed between successive serial stages, the direction of alignment voltage/current to be applied to the first and second electrodes ET1 and ET2 at the step of aligning the light emitting elements LD may match with the direction of driving voltage/current to be applied to the first and second electrodes ET1 and ET2 at the step of actually driving the display device. Hence, in the case where the light emitting elements LD are biased-aligned between the first and second electrodes ET1 and ET2, the number of light emitting elements LD connected in the forward between the first and second electrodes ET1 and ET2 of each pixel PXL may be increased.

In some embodiments, at the step of aligning the light emitting elements LD, the light emitting elements supplied to the emission area EMA may be controlled to be aligned and biased in any one direction (e.g., in a direction corresponding to the forward direction when in operation) by adjusting alignment signals (or alignment voltages) to be applied to the first and second electrodes ET1 and ET2 or by forming a magnetic field. For example, at the step of aligning the light emitting elements LD, as the waveforms of the alignment signals are adjusted or as a magnetic field is formed in each emission area EMA, the number of light emitting elements LD oriented in the forward direction such that each first end EP1 thereof is oriented toward the first electrode ET1 and each second end EP2 thereof is oriented toward the second electrode ET2 can be controlled to be greater than the number of reverse light emitting elements LDrv oriented such that each first end EP1 thereof is oriented toward the second electrode ET2 and each second end EP2 thereof is oriented toward the first electrode ET1. For example, the light emitting elements LD may be aligned by controlling the processing conditions such that a ratio in the number of light emitting elements LD oriented in the forward direction and the number of reverse light emitting elements LDrv oriented in the direction opposite to that of the light emitting elements LD becomes approximately 80:20. Therefore, the number of light emitting elements LD capable of being used as valid light sources to form each light source unit LSU among the light emitting elements supplied to the emission area EMA of each pixel PXL may be increased. That is, in accordance with the foregoing embodiments, the application efficiency of the light emitting elements LD can be enhanced. Furthermore, since the number of light emitting elements LD connected in the forward direction in each serial stage is increased, a phenomenon in which alignment/driving current does not flow in any one serial stage because there is no light emitting elements LD aligned in the forward direction in the serial stage may be prevented, or alignment/driving current may be prevented from being focused on a small number light emitting elements LD aligned in the forward direction. Therefore, each pixel PXL may be reliably driven.

FIGS. 10 to 13 are sectional views each illustrating a pixel PXL in accordance with some embodiments of the present disclosure, and for example, FIGS. 10 to 13 illustrate different embodiments of a cross-section of the first pixel PXL1 corresponding to line I-I' of FIG. 8. In some embodiments, the structures of the second and third pixels PXL2 and PXL3 may be substantially identical or similar to that of the first pixel PXL1. Hereinafter, some embodiments of the cross-sectional structure of each pixel PXL will be described with reference to FIGS. 10 to 13 along with FIGS. 4 to 9.

Referring to FIGS. 4 to 13, the pixel PXL in accordance with some embodiments of the present disclosure and the display device including the pixel PXL may include a display element layer DPL including a plurality of light emitting elements LD disposed in the emission area EMA of each pixel PXL on one surface of the base layer BSL. Furthermore, the pixel PXL and the display device including the pixel PXL may selectively further include a pixel circuit layer PCL. For example, the pixel PXL and the display device including the pixel PXL may further include a pixel circuit layer PCL disposed between the base layer BSL and the display element layer DPL.

In some embodiments, the pixel circuit layer PCL may include at least one circuit element electrically connected to the light emitting elements LD. For example, the pixel circuit layer PCL may include at least one circuit element that forms the pixel circuit PXC of each pixel PXL.

For example, the pixel circuit layer PCL may include a plurality of transistors T and a storage capacitor Cst that are disposed in each pixel area and that form the corresponding pixel circuit PXC, and further include at least one power line and/or a signal line that is connected to the pixel circuit PXC and/or the light source unit LSU. Here, in the case where the pixel circuit PXC is omitted and each light source unit LSU is directly connected to the first and second power lines PL1 and PL2 (or predetermined signal lines), the pixel circuit layer PCL may be omitted. For the sake of explanation, FIGS. 10 to 13 representatively illustrate only one transistor T among the circuit elements and the lines that are disposed on the pixel circuit layer PCL. Here, the plane/section structure of the pixel circuit layer PCL may be changed in various ways. The positions and cross-sectional structures of each transistor T may be changed in various ways depending on embodiments.

Furthermore, the pixel circuit layer PCL may include a plurality of insulating layers disposed between respective electrodes and/or lines. In some embodiments, the pixel circuit layer PCL may include a buffer layer BFL, a gate insulating layer GI, an interlayer insulating layer ILD, and a passivation layer PSV that are successively stacked on one surface of the base layer BSL. In some embodiments, the pixel circuit layer PCL may further include at least one light shielding pattern (not shown) disposed under at least some transistors T.

The buffer layer BFL may prevent impurities from diffusing into each circuit element. The buffer layer BFL may be formed of a single layer, or may be formed of multiple layers having at least two layers. In the case where the buffer layer BFL has a multilayer structure, the respective layers may be formed of the same material or different materials. In some embodiments, the buffer layer BFL may be omitted.

In some embodiments, each transistor T may include a semiconductor layer SCL, a gate electrode GE, and first and second transistor electrodes TE1 and TE2. Although FIGS. 10 to 13 illustrate some embodiments in which each transistor T includes the first and second transistor electrodes TE1 and TE2 that are formed separately from the semiconductor layer SCL, the present disclosure is not limited thereto. For example, in some embodiments, the first and/or second transistor electrode TE1 and/or TE2 provided in at least one transistor T disposed in each pixel area may be integrally formed with the corresponding semiconductor layer SCL.

The semiconductor layer SCL may be disposed on the buffer layer BFL. For example, the semiconductor layer SCL may be disposed between the gate insulating layer GI and the base layer BSL on which the buffer layer BFL is formed. The semiconductor layer SCL may include a first area that comes into contact with each first transistor electrode TE1, a second area that comes into contact with each second transistor electrode TE2, and a channel area disposed between the first and second areas. In some embodiments, one of the first and second areas may be a source area, and the other may be a drain area.

In some embodiments, the semiconductor layer SCL may be a semiconductor pattern formed of polysilicon, amorphous silicon, an oxide semiconductor, etc. The channel area of the semiconductor layer SCL may be an intrinsic semiconductor, which is an undoped semiconductor pattern. Each of the first and second areas of the semiconductor layer SCL may be a semiconductor pattern doped with a predetermined impurity.

The gate electrode GE may be disposed on the semiconductor layer SCL with the gate insulating layer GI interposed therebetween. For example, the gate electrode GE may be disposed between the gate insulating layer GI and the interlayer insulating layer ILD, and may overlap at least one area of the semiconductor layer SCL.

The first and second transistor electrodes TE1 and TE2 may be disposed on the semiconductor layer SCL with at least one interlayer insulating layer ILD interposed therebetween. For example, the first and second transistor electrodes TE1 and TE2 may be disposed on respective ends of the semiconductor layer SCL with the gate insulating layer GI and the interlayer insulating layer ILD interposed therebetween. The first and second transistor electrodes TE1 and TE2 may be electrically connected to the semiconductor layer SCL. For example, the first and second transistor electrodes TE1 and TE2 may be respectively connected to the first and second areas of the semiconductor layer SCL through corresponding contact holes that pass through the gate insulating layer GI and the interlayer insulating layer ILD. In some embodiments, any one of the first and second transistor electrodes TE1 and TE2 may be a source electrode, and the other may be a drain electrode.

At least one transistor T provided in the pixel circuit PXC may be connected to at least one pixel electrode. For example, any one (e.g., the drain electrode) of the first and second transistor electrodes TE1 and TE2 of the first transistor T1 illustrated in FIG. 5E may be electrically connected to the first-serial-stage first electrodes ET1[1] of the corresponding pixel PXL both through a contact hole (e.g., the first contact hole CH1) passing through the passivation layer PSV and through the first electrode line MLI1 provided over the passivation layer PSV.

In some embodiments, at least one signal line and/or power line that is connected to each pixel PXL may be disposed on a same layer as one electrode of each of the circuit elements that form the pixel circuit PXC. For example, the scan line Si of each pixel PXL may be disposed on the same layer as the gate electrodes GE. The data line Dj of each pixel PXL may be disposed on the same layer as the first and second transistor electrodes TE1 and TE2 of the transistors T. Furthermore, the first and/or second power lines PL1 and PL2 may be disposed on the same layer as the gate electrodes GE or the first and second transistor electrodes TE1 and TE2 of the transistors T.

In some embodiments, the display element layer DPL may include a light source unit LSU of each of the pixels PXL. For example, the display element layer DPL may include a plurality of first and second electrodes ET1 and ET2 disposed in the emission area EMA of each pixel PXL, and a plurality of light emitting elements LD arranged between the first and second electrodes ET1 and ET2. Furthermore, the display element layer DPL may selectively further include first and second partition walls PW1 and PW2 configured to cause predetermined areas of the first and second electrodes ET1 and ET2 to protrude upward, and first and second contact electrodes CE1 and CE2 configured to more reliably connect the light emitting elements LD between the first and second electrodes ET1 and ET2. In addition, the display element layer DPL may further include, for example, at least one conductive layer and/or insulating layer.

In some embodiments, the display element layer DPL may include first and second partition walls PW1 and PW2, first and second electrodes ET1 and ET2, a first insulating layer INS1, light emitting elements LD, an insulating pattern INP, first and second contact electrodes CE1 and CE2, and a second insulating layer INS2, which are successively disposed and/or formed over the base layer BSL and/or the pixel circuit layer PCL.

The first and second partition walls PW1 and PW2 may be disposed at positions spaced apart from each other in the emission area of each pixel PXL. The first and second partition walls PW1 and PW2 may protrude from the base layer BSL and/or the pixel circuit layer PCL in a height direction of the base layer BSL. In some embodiments, the first and second partition walls PW1 and PW2 may have substantially the same height, but the present disclosure is not limited thereto.

In some embodiments, the first partition wall PW1 may be disposed between the base layer BSL and/or the pixel circuit layer PCL and each first electrode ET1. The first partition walls PW1 may be disposed adjacent to the first ends EP1 of the light emitting elements LD. For example, one side surface of each of the first partition walls PW1 may be positioned adjacent to the first ends EP1 of the light emitting elements LD and disposed to face the first ends EP1.

In some embodiments, the second partition wall PW2 may be disposed between the base layer BSL and/or the pixel circuit layer PCL and the second electrode ET2. The second partition wall PW2 may be disposed adjacent to the second ends EP2 of the light emitting elements LD. For example, one side surface of the second partition wall PW2 may be positioned adjacent to the second ends EP2 of the light emitting elements LD and disposed to face the second ends EP2.

Figure 10:
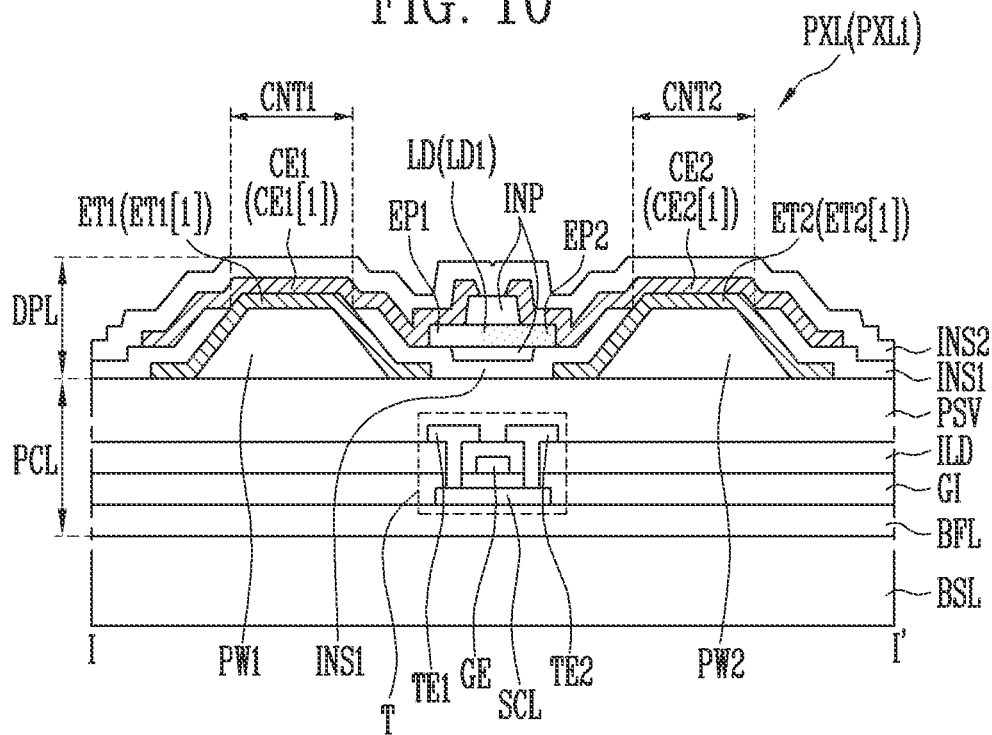
FIGS. 10 to 13 are sectional views each illustrating a pixel in accordance with some embodiments of the present disclosure.
Figure 11:
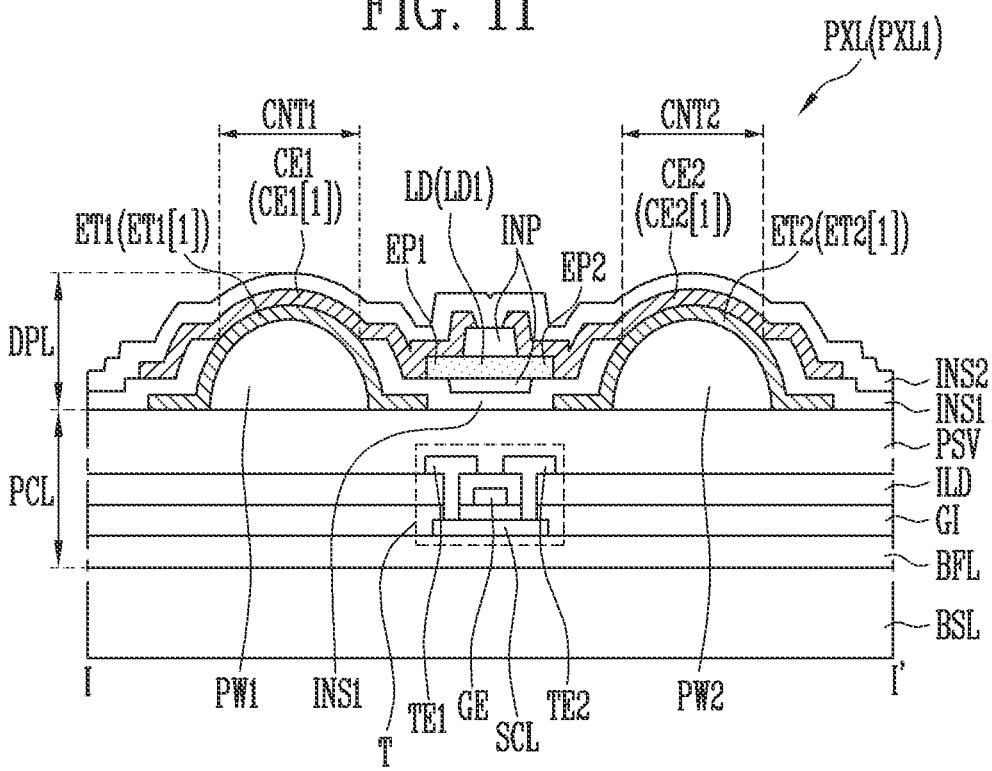
Figure 12:
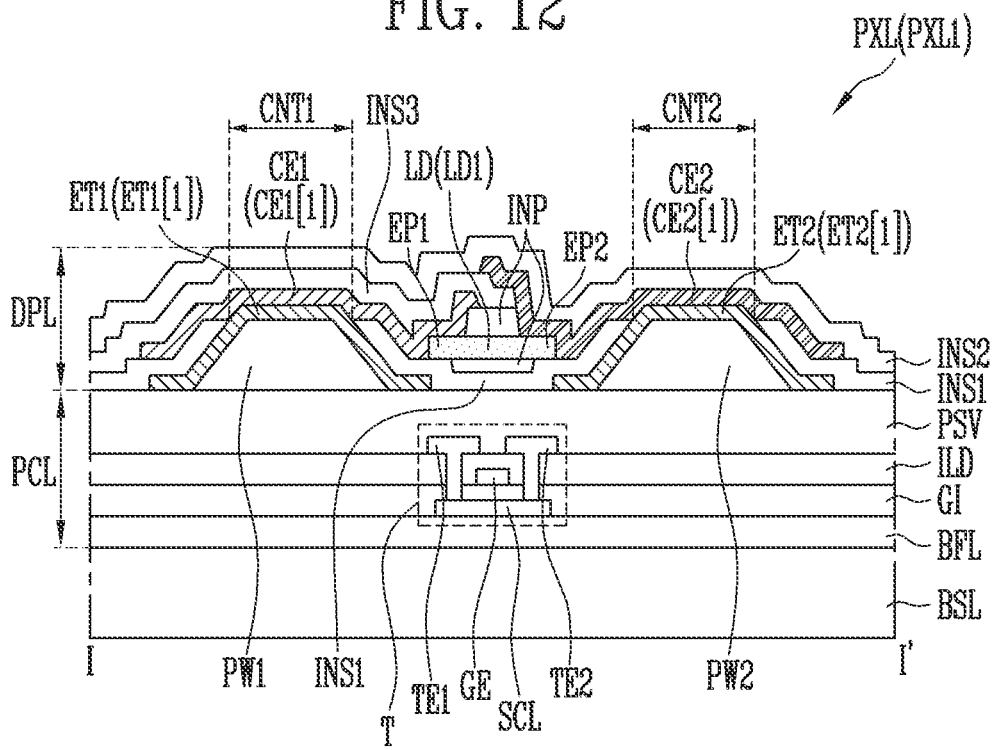
Figure 13:
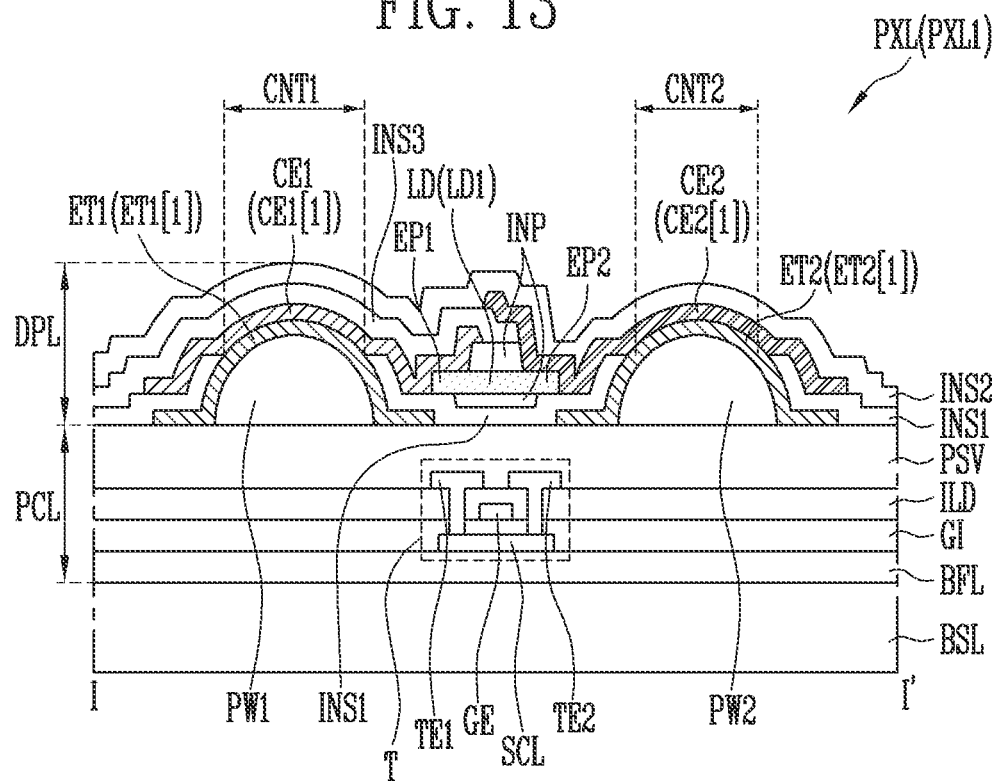

In some embodiments, each of the first and second partition walls PW1 and PW2 may have various shapes. In some embodiments, as illustrated in FIGS. 10 and 12, the first and second partition walls PW1 and PW2 may have a trapezoidal cross-section the width of which is gradually reduced upward. In this case, each of the first and second partition walls PW1 and PW2 may have an inclined surface on at least one side. In some embodiments, as illustrated in FIGS. 11 and 13, the first and second partition walls PW1 and PW2 may have a semi-circular or semi-elliptical cross-section the width of which is gradually reduced upward. In this case, each of the first and second partition walls PW1 and PW2 may have a curved surface on at least one side surface. At least one electrode and/or insulating layer disposed over the first and second partition walls PW1 and PW2 may have a curved surface in an area corresponding to the first and second partition walls PW1 and PW2.

In other words, the shape of each of the first and second partition walls PW1 and PW2 may be changed in various ways rather than being particularly limited. In some embodiments, at least one of the first and second partition walls PW1 and PW2 may be omitted or changed in position.

Each of the first and second partition walls PW1 and PW2 may include insulating material having at least one inorganic material and/or organic material. For example, the first and second partition walls PW1 and PW2 may include at least one inorganic layer including various known inorganic insulating materials such as silicon nitride (SiNx) or silicon oxide (SiOx). Alternatively, the first and second partition walls PW1 and PW2 may include at least one organic layer and/or photoresist layer containing various kinds of known organic insulating materials, or may form a single- or multi-layer insulator containing organic/inorganic materials in combination. In some embodiments of the present disclosure, the constituent materials of the first and second partition walls PW1 and PW2 may be changed in various ways.

In some embodiments, each of the first and second partition walls PW1 and PW2 may function as a reflector. For example, the first and second partition walls PW1 and PW2, along with the first and second electrodes ET1 and ET2 provided on the first and second partition walls PW1 and PW2, may function as reflectors that guide light emitted from each light emitting element LD in a desired direction, thus enhancing the light efficiency of the pixel PXL.

The first and second electrodes ET1 and ET2 may be respectively disposed over the first and second partition walls PW1 and PW2. The first and second electrodes ET1 and ET2 may be disposed at positions spaced apart from each other in each pixel area (for example, each emission area EMA).

In some embodiments, the first and second electrodes ET1 and ET2 that are respectively disposed over the first and second partition walls PW1 and PW2 may have shapes corresponding to the respective shapes of the first and second partition walls PW1 and PW2. For example, the first and second electrodes ET1 and ET2 may have inclined surfaces or curved surfaces corresponding to the first and second partition walls PW1 and PW2 respectively, and protrude in the height direction of the base layer BSL.

Each of the first and second electrodes ET1 and ET2 may include at least one conductive material. For example, each of the first and second electrodes ET1 and ET2 may include at least one material among at least one metal of various metal materials including silver (Ag), magnesium (Mg), aluminum (Al), platinum (Pt), palladium (Pd), gold (Au), nickel (Ni), neodymium (Nd), iridium (Ir), chrome (Cr), titanium (Ti), molybdenum (Mo), copper (Cu), etc., or an alloy thereof, conductive oxide such as indium tin oxide (ITO), indium zinc oxide (IZO), zinc oxide (ZnO), antimony zinc oxide (AZO), indium tin zinc oxide (ITZO), tin oxide ($SnO_2$), and a conductive polymer such as PEDOT, but the present disclosure is not limited thereto. For example, each of the first and second electrodes ET1 and ET2 may include other conductive materials such as a carbon nano tube and a graphene. In other words, each of the first and second electrodes ET1 and ET2 may include at least one of various conductive materials to have conductivity, and the constituent material thereof is not particularly limited. Furthermore, each of the first and second electrodes ET1 and ET2 may have the same conductive material, or at least one different conductive material.

Each of the first and second electrodes ET1 and ET2 may have a single-layer or multilayer structure. For example, each of the first and second electrodes ET1 and ET2 may include at least one reflective electrode layer. Each of the first and second electrodes ET1 and ET2 may selectively further include at least one of at least one transparent electrode layer disposed over and/or under the reflective electrode layer, and at least one conductive capping layer covering an upper portion of the reflective electrode layer and/or the transparent electrode layer.

In some embodiments, the reflective electrode layer of each of the first and second electrodes ET1 and ET2 may be formed of conductive material having a uniform reflectivity. For example, the reflective electrode layer may include at least one of various metal materials including silver (Ag), magnesium (Mg), aluminum (Al), platinum (Pt), palladium (Pd), gold (Au), nickel (Ni), neodymium (Nd), iridium (Ir), chrome (Cr), titanium (Ti), molybdenum (Mo), copper (Cu), etc., or an alloy thereof, but the present disclosure is not limited thereto. In other words, the reflective electrode layer may be formed of various reflective conductive materials. Each of the first and second electrodes ET1 and ET2 that includes the reflective electrode layer may enable light emitted from the opposite ends of each of the light emitting elements LD, i.e., the first and second ends EP1 and EP2, to travel in a direction (e.g., in a frontal direction) in which an image is displayed. For example, if the first and second electrodes ET1 and ET2 respectively have inclined or curved surfaces corresponding to the shapes of the first and second partition walls PW1 and PW2 and are respectively disposed to face the first and second ends EP1 and EP2 of the light emitting elements LID, light emitted from the first and second ends EP1 and EP2 of each light emitting elements LD may be reflected by the first and second electrodes ET1 and ET2 and thus may more reliably travel in the frontal direction of the display panel PNL (e.g., in an upward direction of the base layer BSL). Thereby, the efficiency of light emitted from the light emitting elements LD may be enhanced.

Furthermore, the transparent electrode layer of each of the first and second electrodes ET1 and ET2 may be formed of various transparent conductive materials. For example, the transparent electrode layer may include ITO, IZO or ITZO, but the present disclosure is not limited thereto. In some embodiments, each of the first and second electrodes ET1 and ET2 may have a triple-layer structure having a stacked structure of ITO/Ag/ITO. As such, if the first and second electrodes ET1 and ET2 are each formed of a multilayer structure including at least double or more layers, voltage drop due to signal delay (RC delay) may be reduced or minimized. Thus, a desired voltage can be effectively transmitted to the light emitting elements LD.

In addition, if each of the first and second electrodes ET1 and ET2 includes the conductive capping layer covering the reflective electrode layer and/or the transparent electrode layer, it is possible to prevent the reflective electrode layer of the first and second electrodes ET1 and ET2 from being damaged due to defects caused during the manufacturing process of the pixel PXL. However, the conductive capping layer may be selectively included in the first and second electrodes ET1 and ET2, and may be omitted depending on embodiments. Furthermore, the conductive capping layer may be considered as a component of each of the first and second electrodes ET1 and ET2, or considered as a separate component disposed on the first and second electrodes ET1 and ET2.

The first insulating layer INS1 may be disposed on predetermined areas of the first and second electrode ET1 and ET2. For example, the first insulating layer INS1 may be formed to cover predetermined areas of the first and second electrodes ET1 and ET2, and may include an opening to expose other predetermined areas of the first and second electrodes ET1 and ET2. For example, the first insulating layer INS1 may expose the first and second electrodes ET1 and ET2 at first and second contact portions CNT1 and CNT2, respectively. In some embodiments, the first insulating layer INS1 may be omitted. In this case, the light emitting elements LD may be directly disposed on the passivation layer PSV and/or one end of each of the first and second electrodes ET1 and ET2.

In some embodiments, the first insulating layer INS1 may be primarily formed to cover the overall surfaces of the first and second electrodes ET1 and ET2. After the light emitting elements LD are supplied and aligned on the first insulating layer INS1, the first insulating layer INS1 may be partially open to expose the first and second electrodes ET1 and ET2 in respective predetermined areas (e.g., at the respective first and second contact portions CNT1 and CNT2) on the first and second partition walls PW1 and PW2 In some embodiments, the first insulating layer INS1 may be patterned in the form of an individual pattern that is sectionally disposed under the light emitting elements LD after the supply and alignment of the light emitting elements LD have been completed.

In other words, the first insulating layer INS1 may be interposed between the first and second electrodes ET1 and ET2 and the light emitting elements LD, and may expose at least one area of each of the first and second electrodes ET1 and ET2. After the first and second electrodes ET1 and ET2 are formed, the first insulating layer INS1 may be formed to cover the first and second electrodes ET1 and ET2, so that it is possible to prevent the first and second electrodes ET1 and ET2 from being damaged or to prevent metal from being precipitated in a subsequent process. Furthermore, the first insulating layer INS1 may stably support each light emitting element LD.

The first insulating layer INS1 may be formed of a single layer or multiple layers, and may include at least one inorganic insulating material and/or organic insulating material. For example, the first insulating layer INS1 may include various kinds of organic/inorganic insulating materials including silicon nitride (SiNx), silicon oxide (SiOx), aluminum oxide ($Al_2O_3$), etc. The constituent material of the first insulating layer INS1 is not particularly limited.

A plurality of light emitting elements LD may be supplied to and aligned in each pixel area, for example, the emission area EMA of each pixel PXL, in which the first insulating layer INS1 is formed. For example, a plurality of light emitting elements LD may be supplied to each emission area EMA through an inkjet method or the like, and the light emitting elements LD may be aligned with the directionality between the first and second electrodes ET1 and ET2 by alignment voltages (or alignment signals) applied to the first and second electrodes ET1 and ET2.

In some embodiments, at least some of the light emitting elements LD may be disposed in the horizontal direction between a pair of first and second electrodes ET1 and ET2 such that the opposite ends (i.e., the first and second ends EP1 and EP2) of each light emitting element LD with respect to the longitudinal direction thereof overlap with the pair of first and second electrodes ET1 and ET2. Furthermore, in some embodiments, others of the light emitting elements LD may be disposed in a diagonal direction between the pair of first and second electrodes ET1 and ET2. In some embodiments, at least some of the light emitting elements LD may be disposed between a pair of first and second electrodes ET1 and ET2 such that the at least some light emitting elements LD do not overlap with the first and second electrodes ET1 and ET2, and may be connected to the first and second electrodes ET1 and ET2 respectively through the first contact electrode CE1 and the second contact electrode CE2.

The insulating pattern INP may be disposed on areas/predetermined areas of the light emitting elements LD. For example, the insulating pattern INP may expose the first and second ends EP1 and EP2 of the light emitting elements LD and may be partially disposed over only the predetermined areas of the light emitting elements LD including respective central areas of the light emitting elements LD. The insulating pattern INP may be formed in an independent pattern in each emission area EMA, but the present disclosure is not limited thereto. The insulating pattern INP may be omitted depending on embodiments. In this case, the opposite ends of the first and second contact electrodes CE1 and CE2 may be directly disposed on the light emitting elements LD.

The insulating pattern INP may be formed of a single layer or multiple layers, and may include at least one inorganic insulating material and/or organic insulating material. For example, the insulating pattern INP may include various kinds of organic/inorganic insulating materials including silicon nitride (SiNx), silicon oxide (SiOx), aluminum oxide ($Al_2O_3$), photoresist (PR) material, etc. The constituent material of the insulating pattern INP is not particularly limited.

After the alignment of the light emitting elements LD has been completed, the insulating pattern INP is formed on the light emitting elements LD so that the light emitting elements LD may be prevented from being removed from the aligned position. Furthermore, in the case where space is present between the first insulating layer INS1 and the light emitting elements LD, the space may be filled with the insulating material drawn thereinto during a process of forming the insulating pattern INP. Consequently, the light emitting elements LD may be more stably supported.

The opposite ends of the light emitting elements LD, i.e., the first and second ends EP1 and EP2, which are not covered with the insulating pattern INP, may be respectively covered with the first and second contact electrodes CE1 and CE2. For example, respective ends of the first and second contact electrodes CE1 and CE2 may be disposed, at positions spaced apart from each other, on the first and second ends EP1 and EP2 of the light emitting elements LD, with the insulating pattern INP interposed therebetween.

In some embodiments, the first and second contact electrodes CE1 and CE2 may be concurrently formed on the same layer on one surface of the base layer BSL, as illustrated in FIGS. 10 and 11. Hence, a process of fabricating the pixel PXL and the display device including the pixel PXL may be simplified. For example, compared to the case where the first and second contact electrodes CE1 and CE2 are formed through respective mask processes, the number of mask processes needed to form the pixel PXL may be reduced, and the first and second contact electrodes CE1 and CE2 may be more easily formed.

In some embodiments, the first and second contact electrodes CE1 and CE2 may be successively formed on different layers on one surface of the base layer BSL, as illustrated in FIGS. 12 and 13. An additional third insulating layer INS3 may be disposed between the first and second contact electrodes CE1 and CE2. In other words, the positions and the relative disposition relationship of the first and second contact electrodes CE1 and CE2 may be changed in various ways.

Furthermore, the first and second contact electrodes CE1 and CE2 may be respectively disposed over the first and second electrodes ET1 and ET2 to cover exposed areas (e.g., the first and second contact portions CNT1 and CNT2) of the first and second electrodes ET1 and ET2. For example, the first and second contact electrodes CE1 and CE2 may be respectively disposed on at least predetermined areas of the first and second electrodes ET1 and ET2 to come into contact with the first and second electrodes ET1 and ET2 in the first and second contact portions CNT1 and CNT2, respectively. Hence, the first and second contact electrodes CE1 and CE2 may be respectively electrically connected to the first and second electrodes ET1 and ET2. The first and second electrodes ET1 and ET2 may be respectively electrically connected to the first and second ends EP1 and EP2 of the light emitting elements LD through the first and second contact electrodes CE1 and CE2.

In some embodiments, the first and second contact electrodes CE1 and CE2 may be formed of various transparent conductive materials. For example, the first and second contact electrodes CE1 and CE2 may include at least one of various transparent conductive materials including ITO, IZO, and ITZO, and may be substantially transparent or translucent to satisfy a transmittancy/a predetermined transmittancy. Hence, light emitted from the light emitting elements LD through the first and second ends EP1 and EP2 may be emitted out of the display device through the first and second contact electrodes CE1 and CE2.

The second insulating layer INS2 may be disposed on the first and second contact electrodes CE1 and CE2. For example, the second insulating layer INS2 may be formed and/or disposed on the overall surface of the display area DA of the base layer BSL on which the first and second partition walls PW1 and PW2, the first and second electrodes ET1 and ET2, the light emitting elements LD, the insulating pattern INP, and the first and second contact electrodes CE1 and CE2 are formed, so that the second insulating layer INS2 may cover the first and second partition walls PW1 and PW2, the first and second electrodes ET1 and ET2, the light emitting elements LD, the insulating pattern INP, and the first and second contact electrodes CE1 and CE2. The second insulating layer INS2 may include at least one inorganic layer and/or organic layer.

In some embodiments, the second insulating layer INS2 may include a thin-film encapsulation layer having a multilayer structure, but the present disclosure is not limited thereto. In some embodiments, at least one overcoat layer, and/or an encapsulation substrate, etc., may be further disposed over the second insulating layer INS2.

In some embodiments, the second insulating layer INS2 may be formed of a single layer or multiple layers, and may include at least one inorganic insulating material and/or organic insulating material. For example, the second insulating layer INS2 may include various kinds of known organic/inorganic insulating materials including silicon nitride (SiNx), silicon oxide (SiOx), etc. The constituent material of the second insulating layer INS2 is not particularly limited.

Figure 14A:
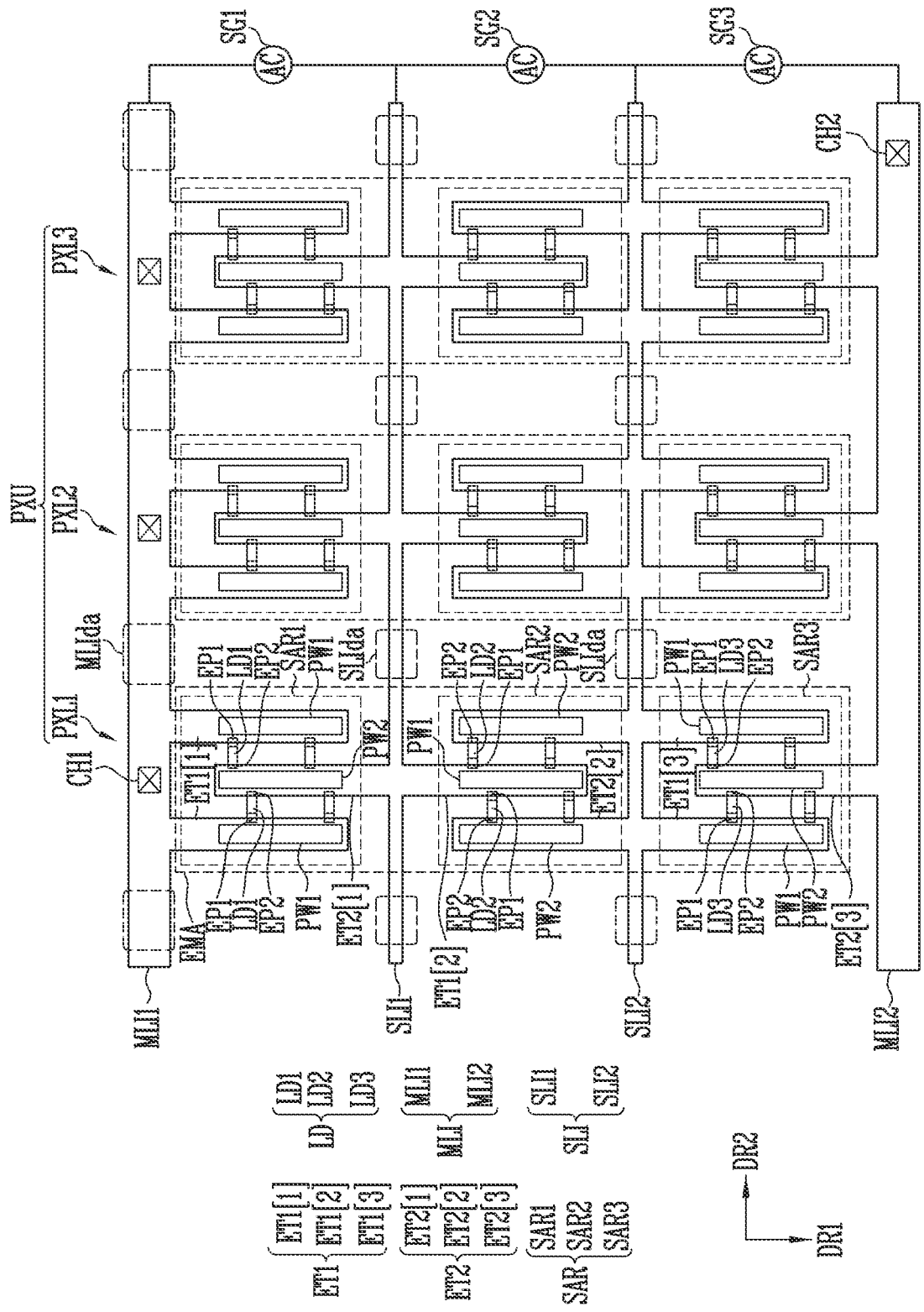
FIGS. 14A to 14C are plan views sequentially illustrating a method of fabricating a display device in accordance with some embodiments of the present disclosure.
Figure 14B:
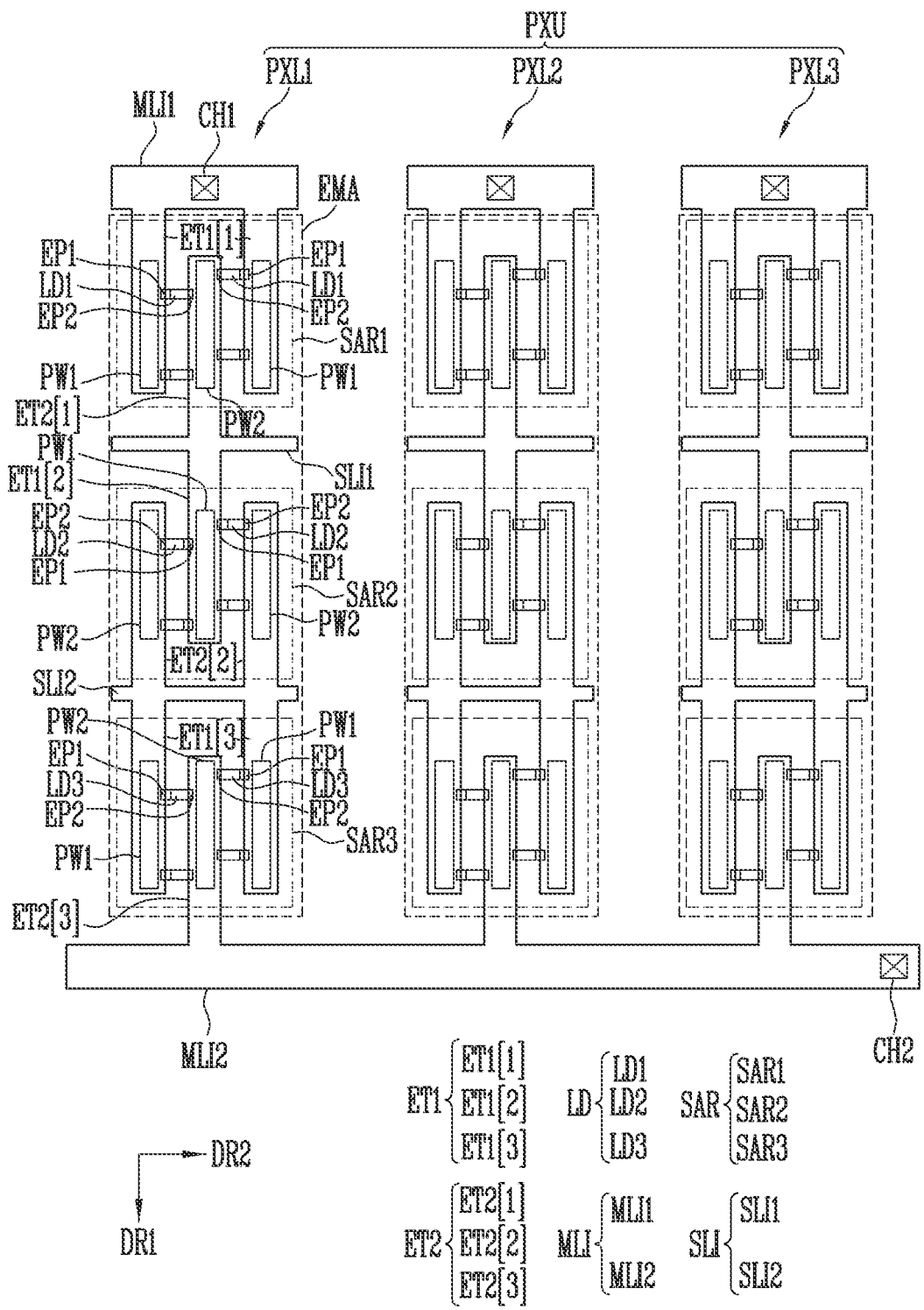
Figure 14C:
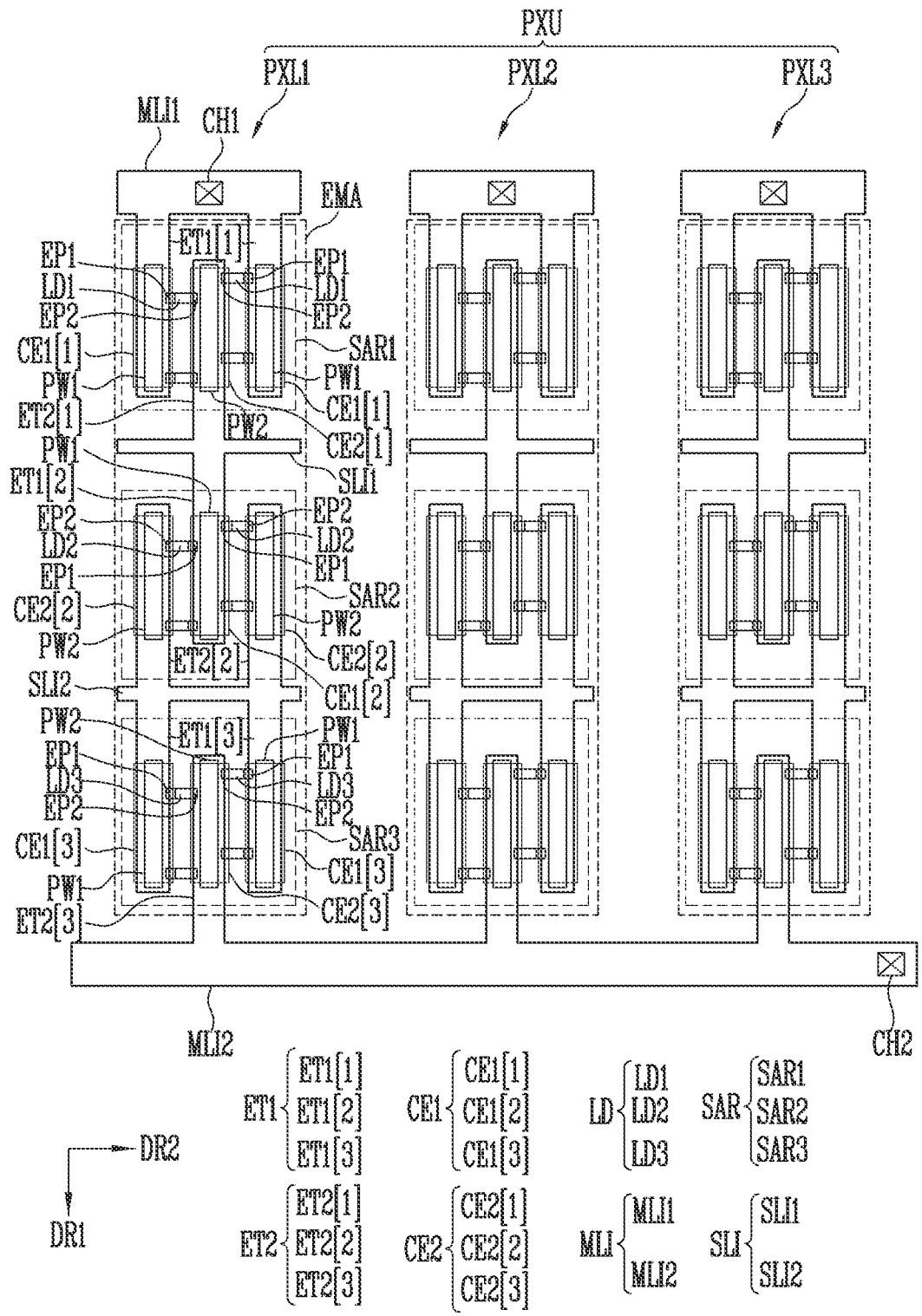

FIGS. 14A to 14C are plan views sequentially illustrating a method of fabricating a display device in accordance with some embodiments of the present disclosure and for example illustrate some embodiments of a method of fabricating a display device including the pixel unit PXU of FIG. 8. In FIGS. 14A to 14C, illustration of the bank BNK will be omitted to more clearly show connection/disconnection structure of the electrode lines MLI between the pixels PXL.

Referring to FIGS. 4 to 14A, the first and second electrodes ET1 and ET2 of the pixels PXL, the first and second electrode lines MLI1 and MLI2, and the intermediate electrodes SLI, etc. may be formed on the base layer BLS (or on the base layer BLS on which the pixel circuit layer PCL is formed). A plurality of light emitting elements LD may be supplied to the emission area EMA of each pixel PXL on which the first and second electrodes ET1 and ET2, the first and second electrode lines MLI1 and MLI2, and the intermediate electrodes SLI are formed. The light emitting elements LD may be aligned between the first and second electrodes ET1 and ET2 by applying an alignment signal between the first and second electrode lines MLI1 and MLI2 and the intermediate electrodes SLI. At the step of aligning the light emitting elements LD, the first and second electrode lines MLI1 and MLI2 may be main alignment lines through which alignment current corresponding to the alignment signal flows, and the intermediate electrodes SLI may be sub-alignment lines for directly applying the alignment signal between the serial stages.

In some embodiments, the first and second electrode lines MLI1 and MLI2 and the intermediate electrodes SLI may be first connected in common to a plurality of pixels PXL. For example, the first electrode line MLI1 of the first pixel PXL1 may be integrally formed with the first electrode lines MLI1 of the second and third pixels PXL2 and PXL3. The second electrode line MLI2 of the first pixel PXL1 may be integrally formed with the second electrode lines MLI2 of the second and third pixels PXL2 and PXL3. For example, the first electrode line MLI1 may be first formed to have a closed state rather than being in an open state in an open line area MLIda between the first to third pixels PXL1 to PXL3.

Likewise, each intermediate electrode SLI of the first pixel PXL1 may be integrally formed with the corresponding intermediate electrodes SLI of the second and third pixels PXL2 and PXL3 (e.g., disposed between successive serial stages of the same row or the same order). For example, the first intermediate electrode SLI1 disposed between the first and second serial stages of the first pixel PXL1 may be integrally formed with the first intermediate electrodes SLI1 disposed between the first and second serial stages of the second and third pixels PXL2 and PXL3. The second intermediate electrode SLI2 disposed between the second and third serial stages of the first pixel PXL1 may be integrally formed with the second intermediate electrodes SLI2 disposed between the second and third serial stages of the second and third pixels PXL2 and PXL3. For example, each intermediate electrode SLI may be first formed to have a closed state rather than being in an open state in an open line area SLIda between the first to third pixels PXL1 to PXL3.

In some embodiments, since an alignment signal is supplied through the first and second electrode lines MLI1 and MLI2 and the intermediate electrodes SLI, the alignment voltage may be directly applied between the first and second electrodes ET1 and ET2 of each serial stage. For example, as first, second, and third alignment signal generators SG1, SG2, and SG3 (or different output channels of a single signal generator) are respectively connected between the first electrode lines MLI1 and the first intermediate electrode SLI1, between the first intermediate electrode all and the second intermediate electrode SLI2, and between the second intermediate electrode SLI2 and the second electrode line MLI2, an AC voltage/predetermined AC voltage may be applied to each serial stage.

Referring to FIGS. 14A and 14B, after the alignment of the light emitting elements LD has been completed, the first electrode line MLI1 is open in the open line area MLIda between adjacent pixels PXL, so that the first electrode lines MLI1 of the pixels PXL may be separated from each other. Furthermore, with regard to the intermediate electrodes SLI, the intermediate electrodes SLI are open in the open line area SLIda between adjacent pixels PXL, so that the intermediate electrodes SLI of the pixels PXL may be separated from each other.

Referring to FIG. 14C, each first contact electrode CE1 may be formed on a respective first electrode ET1 and respective first ends EP1 of the light emitting elements LD adjacent thereto. Each second contact electrode CE2 may be formed on a respective second electrode ET2 and respective second ends EP2 of the light emitting elements LD adjacent thereto. Consequently, the light emitting elements LD may be reliably connected between the first and second electrodes ET1 and ET2.

In some embodiments, the step of separating the first electrode lines MLI1 and the intermediate electrodes SLI illustrated in FIG. 14B and the step of forming the first and second contact electrodes CE1 and CE2 illustrated in FIG. 14C may be performed in a reverse sequence. For example, in some embodiments of the present disclosure, after the alignment of the light emitting elements LD has been completed, the first and second contact electrodes CE1 and CE2 are respectively formed on the first and second ends EP1 and EP2 of the light emitting elements LD, and thereafter the first electrode lines MLI1 and the intermediate electrodes SLI may be separated between the pixels PXL.

Furthermore, in some embodiments, in the case where each pixel PXL does not include the first and second contact electrodes CE1 and CE2, the process of forming the first and second contact electrodes CE1 and CE2 may be omitted. In this case, each first electrode ET1 may be directly connected to the first ends EP1 of the adjacent light emitting elements LD, and each second electrode ET2 may be directly connected to the second ends EP2 of the adjacent light emitting elements LD.

Figure 15:
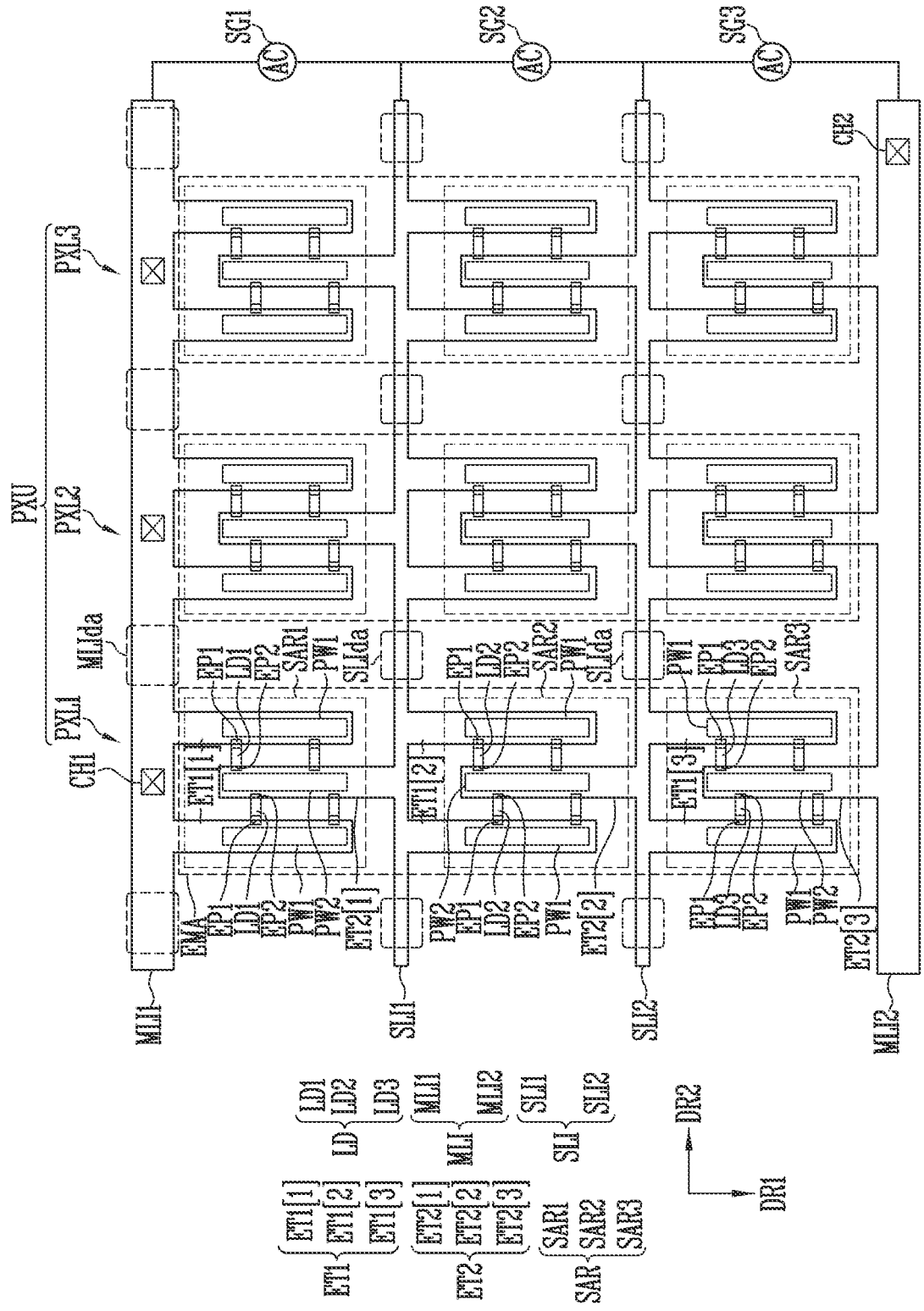
FIGS. 15 and 16 are plan views each illustrating a method of fabricating a display device in accordance with some embodiments of the present disclosure, and for example illustrate different modified embodiments pertaining to the embodiments of FIG. 14A.
Figure 16:
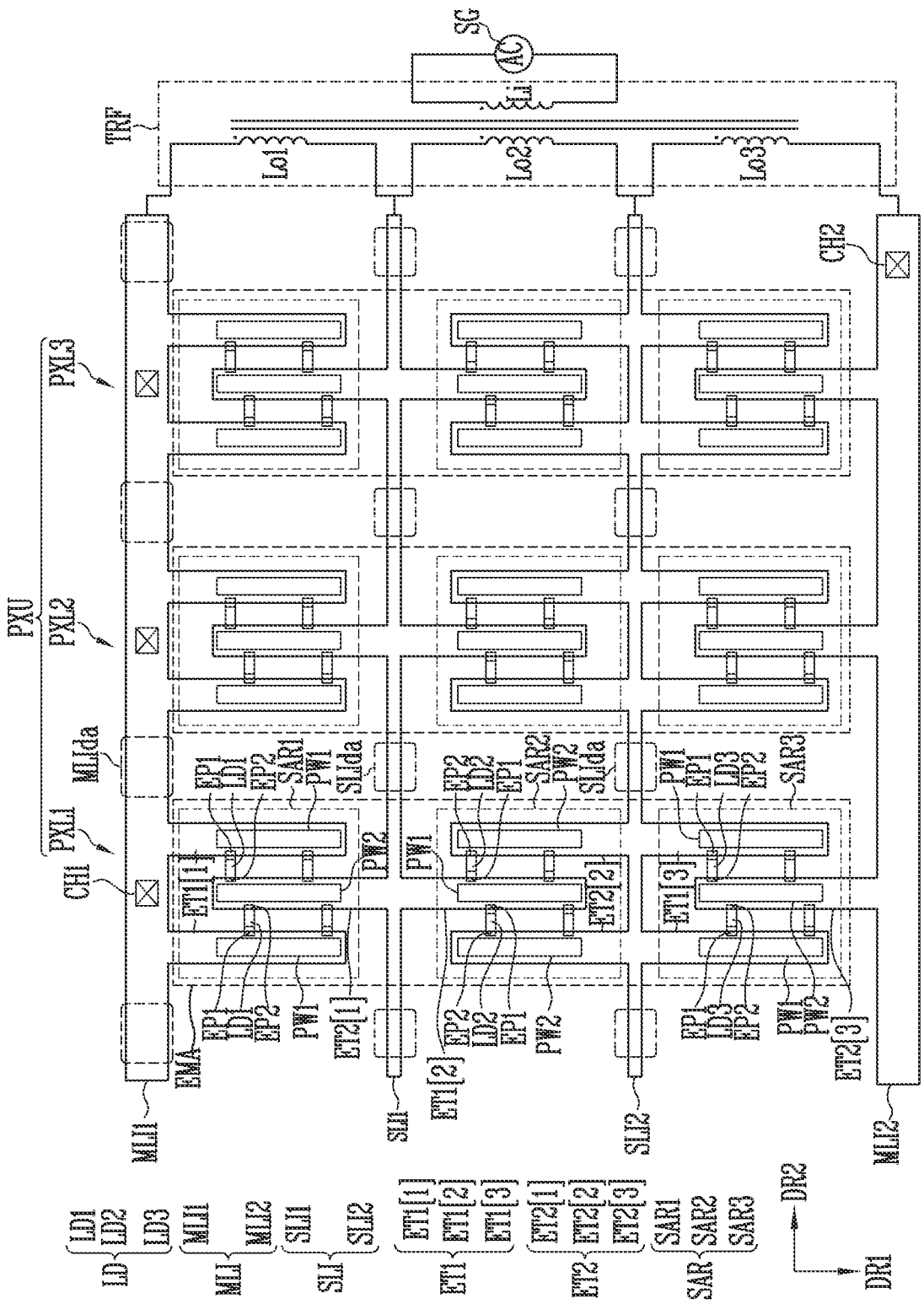

FIGS. 15 to 16 are plan views each illustrating a method of fabricating a display device in accordance with some embodiments of the present disclosure, and for example illustrate different modified embodiments pertaining to the embodiments of FIG. 14A. In the description of the embodiments of FIGS. 15 and 16, detailed descriptions of configurations similar or identical to those of the embodiments of FIG. 14A will be omitted.

Referring to FIG. 15, the shapes and/or the disposition structure of the first and second electrodes ET1 and ET2 may be changed in various ways depending on embodiments. In some embodiments, although the shapes and/or the disposition structure of the first and second electrodes ET1 and ET2 is changed, the light emitting elements LD may be aligned between the first and second electrodes ET1 and ET2 of each serial stage in substantially the same manner as that of the embodiments of FIG. 14A. For example, in the embodiments of FIG. 15, an AC voltage may also be applied to each serial stage by connecting the alignment signal generators (e.g., the first, second, and third alignment signal generators SG1, SG2, and SG3) respectively between the first electrode lines MLI1 and the first intermediate electrode SLI1, between the first intermediate electrode SLI1 and the second intermediate electrode SLI2, and between the second intermediate electrode SLI2 and the second electrode line MLI2.

Referring to FIG. 16, at the step of aligning the light emitting elements LD, an AC voltage output from a single alignment signal generator SG may be distributed and supplied to a plurality of serial stages by a power transformer TRF. For example, the power transformer TRF may be connected between the alignment signal generator SG configured to output an AC voltage, the first and second electrode lines MLI1 and MLI2, and the intermediate electrodes SLI. In some embodiments, the power transformer TRF may include output cods corresponding to the respective serial stages. For example, the power transformer TRF may include an input coil Li connected to the alignment signal generator SG, and first, second, and third cods Lo1, Lo2, and Lo3 connected to the opposite ends of the first, second, and third serial stages, respectively. In other words, a method of applying an alignment signal may be changed in various ways depending on embodiments. For example, alignment signals may be supplied to the first and second electrodes ET1 and ET2 of each serial stage by various power systems and/or power supply methods.

In various embodiments of the present disclosure described above, at the steps of aligning and driving the light emitting elements LD, the serial structure may be used in the same manner. For example, at both the alignment and driving steps, the light emitting elements LD may be connected in a serial/parallel combination structure. Hence, the efficiency of power used to align the light emitting elements LD may be improved, and the light emitting elements LD aligned (e.g., biased-aligned) between the first and second electrodes ET1 and ET2 may be more efficiently used to form each light source unit LSU. Furthermore, alignment/driving current that flows through the display panel PNL may be reduced by applying at least a serial structure to each light source unit LSU, so that the capacity of the amplifier disposed on an output terminal of the power supply (e.g., the power system for applying an alignment signal) that is used when the light emitting elements LD are aligned, and the width of the first and/or second electrode lines MLI1 and MLI2 may be selectively reduced.

While the spirit and scope of the present disclosure are described by detailed embodiments, it should be noted that the above-described embodiments are merely descriptive and should not be considered limiting. It should be understood by those skilled in the art that various changes, substitutions, and alternations may be made herein without departing from the scope of the disclosure as defined by the claims and their functional equivalents.

The scope of the present disclosure is not limited by detailed descriptions of the present specification, and should be defined by the accompanying claims and their functional equivalents. Furthermore, all changes or modifications of the present disclosure derived from the meanings and scope of the claims, and equivalents thereof should be construed as being included in the scope of the present disclosure.

The invention claimed is:

1. A display device comprising a pixel disposed in a display area, the pixel comprising:
   a first electrode extending in a first direction;
   a second electrode including a first electrode part spaced apart from the first electrode in a direction intersecting with the first direction and extending in the first direction, a second electrode part extending from the first electrode part in a second direction, and a third electrode part extending form the second electrode part in the first direction;
   a third electrode including at least one area spaced apart from the third electrode part in the direction intersecting with the first direction, and extending in the first direction;
   a first light emitting element connected between the first electrode and the second electrode; and
   a second light emitting element connected between the second electrode and the third electrode,
   wherein the first light emitting element includes a P-type end electrically connected to the first electrode, and an N-type end electrically connected to the second electrode, and
   wherein the second light emitting element includes a P-type end electrically connected to the second electrode, and an N-type end electrically connected to the third electrode.

2. The display device according to claim 1, wherein the second electrode part is disposed between the first electrode and the third electrode.

3. The display device according to claim 1, wherein the first electrode is spaced apart from the first electrode part with respect to the second direction, and
   wherein the third electrode is spaced apart from the third electrode part with respect to the second direction.

4. The display device according to claim 1, wherein the first electrode and the at least one area of the third electrode are offset from each other with respect to a line extending in the first direction, and
   wherein the first electrode part and the third electrode part are aligned in the first direction.

5. The display device according to claim 1, wherein the first electrode and the third electrode part are offset from each other with respect to a line extending in the first direction, and
   wherein the first electrode part and the at least one area of the third electrode are offset from each other with respect to a line in the first direction.

6. The display device according to claim 1, further comprising:
   a first electrode line electrically connected to the first electrode, and configured to be supplied with a first power voltage or a first driving signal; and a second electrode line electrically connected to the third electrode, and configured to be supplied with a second power voltage or a second driving signal.

7. The display device according to claim 6, further comprising:
- a third light emitting element including a P-type end electrically connected to the third electrode, and an N-type end opposite to the P-type end; and
- a fourth electrode electrically connected between the N-type end of the third light emitting element and the second electrode line.

8. A display device comprising a first pixel including light emitting elements provided in a plurality of serial stages,
wherein the first pixel comprises:
- first to K-th (K is a natural number of 2 or more) sub-areas respectively corresponding to first to K-th serial stages;
- first and second electrodes of each of the serial stages disposed at positions spaced apart from each other in each of the first to K-th sub-areas;
- first to K-th light emitting elements connected between the first and second electrodes in the first to K-th sub-areas, respectively;
- a first electrode line connected to a first electrode of the first sub-area;
- a second electrode line connected to a second electrode of the K-th sub-area; and
- at least one intermediate electrode disposed between two successive sub-areas of the first to K-th sub-areas, and connected to a second electrode of a preceding sub-area and a first electrode of a subsequent sub-area,
- wherein the at least one intermediate electrode extends in a direction intersecting with a direction in which the first and second electrodes extend.

9. The display device according to claim 8, wherein the first and second electrode lines are disposed to face each other with the first to K-th sub-areas interposed therebetween, and
wherein each of the first and second electrode lines extends in the direction intersecting with the direction in which the first and second electrodes extend.

10. The display device according to claim 9, wherein the first and second electrode lines and the at least one intermediate electrode are disposed in parallel to each other with at least one sub-area interposed therebetween.

11. The display device according to claim 8, wherein the first to K-th sub-areas are successively disposed in a first direction, and
wherein the at least one intermediate electrode extends in a second direction intersecting with the first direction between the two successive sub-areas.

12. The display device according to claim 11, wherein the first and second electrodes extend in the first direction and are disposed in parallel to each other in each of the first to K-th sub-areas.

13. The display device according to claim 12, wherein the first and second electrodes are disposed at regular intervals in each of the first to K-th sub-areas.

14. The display device according to claim 8, wherein the at least one intermediate electrode is integrally connected to the second electrode of the preceding sub-area and the first electrode of the subsequent sub-area.

15. The display device according to claim 8, wherein the at least one intermediate electrode has a width that is less than a width of each of the first and second electrode lines.

16. The display device according to claim 8, wherein the first electrode line is supplied with a first power voltage or a first driving signal, and wherein the second electrode line is supplied with a second power voltage or a second driving signal.

17. The display device according to claim 16, wherein the first pixel further comprises a pixel circuit connected between the first electrode line and a first power supply which supplies the first power voltage.

18. The display device according to claim 8, wherein the first and second electrodes are disposed in a substantially identical repetitive pattern in each of the first to K-th sub-areas.

19. The display device according to claim 8, wherein the first and second electrodes are disposed in a substantially symmetrical shape based on the at least one intermediate electrode in the two successive sub-areas.

20. The display device according to claim 8, further comprising a second pixel having a structure that is substantially identical with the first pixel and disposed adjacent to the first pixel,
wherein the first electrode line and the at least one intermediate electrode of the first pixel and a first electrode line and at least one intermediate electrode of the second pixel are separated from each other between the first and second pixels.

21. The display device according to claim 20, wherein the second electrode lines of the first and second pixels are integrally connected with each other.

22. The display device according to claim 8, wherein the first pixel further comprises at least one reverse light emitting element connected between the first and second electrodes in a direction opposite to the light emitting elements in at least one of the plurality of serial stages, and
wherein a number of reverse light emitting elements is less than a number of light emitting elements.

23. The display device according to claim 8, wherein the first pixel further comprises at least one of:
- first partition walls disposed under a respective one of the first electrodes;
- second partition walls disposed under a respective one of the second electrodes;
- first contact electrodes disposed over the respective one of the first electrodes and each configured to electrically connect the respective one of the first electrodes to a first end of at least one of the light emitting elements; and
- second contact electrodes disposed over the respective one of the second electrodes and each configured to electrically connect the respective one of the second electrodes to a second end of at least one of the light emitting elements.

24. The display device according to claim 8, further comprising a bank configured to integrally enclose an emission area of the first pixel including the first to K-th sub-areas.

25. A display device comprising a pixel disposed in a display area, the pixel comprising:
- a first electrode extending in a first direction;
- a second electrode including a first electrode part spaced apart from the first electrode in a direction intersecting with the first direction and extending in the first direction, a second electrode part extending from the first electrode part in a second direction, and a third electrode part extending from the second electrode part in the first direction;
- a third electrode including at least one area spaced apart from the third electrode part in the direction intersecting with the first direction, and extending in the first direction;

a first light emitting element connected between the first electrode and the second electrode; and a second light emitting element connected between the second electrode and the third electrode, wherein the first electrode and the at least one area of the third electrode are offset from each other with respect to a line extending in the first direction, and wherein the first electrode part and the third electrode part are aligned in the first direction.

26. A display device comprising a pixel disposed in a display area, the pixel comprising:

a first electrode extending in a first direction;

a second electrode including a first electrode part spaced apart from the first electrode in a direction intersecting with the first direction and extending in the first direction, a second electrode part extending from the first electrode part in a second direction, and a third electrode part extending from the second electrode part in the first direction;

a third electrode including at least one area spaced apart from the third electrode part in the direction intersecting with the first direction, and extending in the first direction;

a first light emitting element connected between the first electrode and the second electrode; and a second light emitting element connected between the second electrode and the third electrode, wherein the first electrode and the third electrode part are offset from each other with respect to a line extending in the first direction, and wherein the first electrode part and the at least one area of the third electrode are offset from each other with respect to a line in the first direction.

27. A display device comprising a pixel disposed in a display area, the pixel comprising:

a first electrode extending in a first direction;

a second electrode including a first electrode part spaced apart from the first electrode in a direction intersecting with the first direction and extending in the first direction, a second electrode part extending from the first electrode part in a second direction, and a third electrode part extending from the second electrode part in the first direction;

a third electrode including at least one area spaced apart from the third electrode part in the direction intersecting with the first direction, and extending in the first direction;

a first light emitting element connected between the first electrode and the second electrode; and a second light emitting element connected between the second electrode and the third electrode, wherein the display device further comprises: a first electrode line electrically connected to the first electrode, and configured to be supplied with a first power voltage or a first driving signal; and a second electrode line electrically connected to the third electrode, and configured to be supplied with a second power voltage or a second driving signal, and wherein the display device further comprises: a third light emitting element including a P-type end electrically connected to the third electrode, and an N-type end opposite to the P-type end; and a fourth electrode electrically connected between the N-type end of the third light emitting element and the second electrode line.

* * * * *